US009058446B2

(12) United States Patent
Lu et al.

(10) Patent No.: US 9,058,446 B2
(45) Date of Patent: Jun. 16, 2015

(54) FLEXIBLE AND ADAPTIVE FORMULATIONS FOR COMPLEX RESERVOIR SIMULATIONS

(75) Inventors: Pengbo Lu, Sugar Land, TX (US); Bret L. Beckner, Houston, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 117 days.

(21) Appl. No.: 13/812,828

(22) PCT Filed: Jun. 29, 2011

(86) PCT No.: PCT/US2011/042408
§ 371 (c)(1),
(2), (4) Date: Jan. 28, 2013

(87) PCT Pub. No.: WO2012/039811
PCT Pub. Date: Mar. 29, 2012

(65) Prior Publication Data
US 2013/0124173 A1    May 16, 2013

Related U.S. Application Data

(60) Provisional application No. 61/384,557, filed on Sep. 20, 2010.

(51) Int. Cl.
*G06G 7/48*     (2006.01)
*G06F 17/50*    (2006.01)
(Continued)

(52) U.S. Cl.
CPC ............. *G06F 17/5009* (2013.01); *E21B 49/00* (2013.01); *G06F 17/11* (2013.01); *G01V 11/00* (2013.01)

(58) Field of Classification Search
CPC ...... E21B 49/00; G06F 17/11; G06F 2217/16
USPC ........................................................ 703/2, 10
See application file for complete search history.

(56) References Cited

U.S. PATENT DOCUMENTS 5,537,320 A    7/1996    Simpson et al.
5,671,136 A    9/1997    Willhoit, Jr.
(Continued)

FOREIGN PATENT DOCUMENTS

EP    1653411    10/2004
EP    1707993    3/2005
(Continued)

OTHER PUBLICATIONS

Byer, T.J. et al. (1998), "Preconditioned Newton Methods for Fully Coupled Reservoir and Surface Facility Models," *SPE 49001, 1998 SPE Annual Tech. Conf. and Exh.*, pp. 181-188.
(Continued)

*Primary Examiner* — Aniss Chad
(74) *Attorney, Agent, or Firm* — ExxonMobil Upstream Research Company Law Dept.

(57) ABSTRACT

A method for performing a simulation of a subsurface hydrocarbon reservoir is disclosed. Each cell in a reservoir model has an equation set representing a reservoir property. A stability limit is determined for each cell. Each cell is assigned to an explicit or implicit formulation. A solution to the system of equations is solved for using an initial guess and an explicit or implicit formulation. A stability limit is calculated for the converged cells. When the number of unconverged cells is greater than a predetermined amount, a reduced nonlinear system is constructed with a list of unconverged cells. The reduced nonlinear system is solved with the implicit formulation, and other cells are solved with the explicit formulation. Parts of the method are repeated until all equation sets satisfy a convergence criterion and a stability criterion, and the solved solution is output.

24 Claims, 14 Drawing Sheets

(51) Int. Cl.
*G01V 11/00* (2006.01)
*E21B 49/00* (2006.01)
*G06F 17/11* (2006.01)

(56) References Cited

U.S. PATENT DOCUMENTS

| | | | |
|---|---|---|---|
| 5,706,194 A | 1/1998 | Neff et al. |
| 5,710,726 A | 1/1998 | Rowney et al. |
| 5,747,673 A | 5/1998 | Ungerer et al. |
| 5,838,634 A | 11/1998 | Jones et al. |
| 5,844,799 A | 12/1998 | Joseph et al. |
| 5,953,680 A | 9/1999 | Divies et al. |
| 5,992,519 A | 11/1999 | Ramakrishnan et al. |
| 6,018,498 A | 1/2000 | Neff et al. |
| 6,052,520 A | 4/2000 | Watts, III |
| 6,106,561 A | 8/2000 | Farmer |
| 6,128,577 A | 10/2000 | Assa et al. |
| 6,128,579 A | 10/2000 | McCormack et al. |
| 6,138,076 A | 10/2000 | Graf et al. |
| 6,230,101 B1 | 5/2001 | Wallis |
| 6,374,185 B1 | 4/2002 | Taner et al. |
| 6,480,790 B1 | 11/2002 | Calvert et al. |
| 6,549,854 B1 | 4/2003 | Malinverno et al. |
| 6,597,995 B1 | 7/2003 | Cornu et al. |
| 6,662,146 B1 | 12/2003 | Watts |
| 6,664,961 B2 | 12/2003 | Ray et al. |
| 6,823,296 B2 | 11/2004 | Rey-Fabret et al. |
| 6,823,297 B2 | 11/2004 | Jenny et al. |
| 6,826,483 B1 | 11/2004 | Anderson et al. |
| 6,826,520 B1 | 11/2004 | Khan et al. |
| 6,826,521 B1 | 11/2004 | Hess et al. |
| 6,839,632 B2 | 1/2005 | Grace |
| 6,901,391 B2 | 5/2005 | Storm, Jr. et al. |
| 6,940,507 B2 | 9/2005 | Repin et al. |
| 6,980,940 B1 | 12/2005 | Gurpinar et al. |
| 6,987,878 B2 | 1/2006 | Lees et al. |
| 7,043,367 B2 | 5/2006 | Granjeon |
| 7,069,149 B2 | 6/2006 | Goff et al. |
| 7,089,166 B2 | 8/2006 | Malthe-Sorenssen et al. |
| 7,096,122 B2 | 8/2006 | Han |
| 7,096,172 B2 | 8/2006 | Colvin et al. |
| 7,177,787 B2 | 2/2007 | Rey-Fabret et al. |
| 7,191,071 B2 | 3/2007 | Kfoury et al. |
| 7,254,091 B1 | 8/2007 | Gunning et al. |
| 7,277,796 B2 | 10/2007 | Kuchuk et al. |
| 7,280,952 B2 | 10/2007 | Butler et al. |
| 7,286,972 B2 | 10/2007 | Maker |
| 7,363,163 B2 | 4/2008 | Valec-Dupin et al. |
| 7,369,980 B2 | 5/2008 | Deffenbaugh et al. |
| 7,376,539 B2 | 5/2008 | Lecomte |
| 7,379,853 B2 | 5/2008 | Middya |
| 7,379,854 B2 | 5/2008 | Calvert et al. |
| 7,406,878 B2 | 8/2008 | Rieder et al. |
| 7,412,363 B2 | 8/2008 | Callegari |
| 7,415,401 B2 | 8/2008 | Calvert et al. |
| 7,424,415 B2 | 9/2008 | Vassilev |
| 7,433,786 B2 | 10/2008 | Adams |
| 7,451,066 B2 | 11/2008 | Edwards et al. |
| 7,467,044 B2 | 12/2008 | Tran et al. |
| 7,478,024 B2 | 1/2009 | Gurpinar et al. |
| 7,480,205 B2 | 1/2009 | Wei |
| 7,486,589 B2 | 2/2009 | Lee et al. |
| 7,505,882 B2 * | 3/2009 | Jenny et al. ............... 703/2 |
| 7,516,056 B2 | 4/2009 | Wallis et al. |
| 7,523,024 B2 | 4/2009 | Endres et al. |
| 7,526,418 B2 | 4/2009 | Pita et al. |
| 7,539,625 B2 | 5/2009 | Klumpen et al. |
| 7,542,037 B2 | 6/2009 | Fremming |
| 7,546,229 B2 | 6/2009 | Jenny et al. |
| 7,548,840 B2 | 6/2009 | Saaf |
| 7,577,527 B2 | 8/2009 | Velasquez |
| 7,584,081 B2 | 9/2009 | Wen et al. |
| 7,596,056 B2 | 9/2009 | Keskes et al. |
| 7,596,480 B2 | 9/2009 | Fung et al. |
| 7,603,265 B2 | 10/2009 | Mainguy et al. |
| 7,606,691 B2 | 10/2009 | Calvert et al. |
| 7,617,082 B2 | 11/2009 | Childs et al. |
| 7,620,800 B2 | 11/2009 | Huppenthal et al. |
| 7,640,149 B2 | 12/2009 | Rowan et al. |
| 7,657,494 B2 | 2/2010 | Wilkinson et al. |
| 7,672,825 B2 | 3/2010 | Brouwer et al. |
| 7,684,929 B2 | 3/2010 | Prange et al. |
| 7,706,981 B2 | 4/2010 | Wilkinson et al. |
| 7,711,532 B2 | 5/2010 | Dulac et al. |
| 7,716,029 B2 | 5/2010 | Couet et al. |
| 7,739,089 B2 | 6/2010 | Gurpinar et al. |
| 7,752,023 B2 | 7/2010 | Middya |
| 7,756,694 B2 | 7/2010 | Graf et al. |
| 7,783,462 B2 | 8/2010 | Landis, Jr. et al. |
| 7,796,469 B2 | 9/2010 | Keskes et al. |
| 7,809,537 B2 | 10/2010 | Hemanthkumar et al. |
| 7,809,538 B2 | 10/2010 | Thomas |
| 7,822,554 B2 | 10/2010 | Zuo et al. |
| 7,844,430 B2 | 11/2010 | Landis, Jr. et al. |
| 7,860,654 B2 | 12/2010 | Stone |
| 7,869,954 B2 | 1/2011 | Den Boer et al. |
| 7,877,246 B2 * | 1/2011 | Moncorge et al. ............... 703/10 |
| 7,878,268 B2 | 2/2011 | Chapman et al. |
| 7,920,970 B2 | 4/2011 | Zuo et al. |
| 7,925,481 B2 | 4/2011 | Van Wagoner et al. |
| 7,932,904 B2 | 4/2011 | Branets et al. |
| 7,933,750 B2 | 4/2011 | Morton et al. |
| 7,953,585 B2 | 5/2011 | Gurpinar et al. |
| 7,970,593 B2 | 6/2011 | Roggero et al. |
| 7,986,319 B2 | 7/2011 | Dommisse |
| 7,991,600 B2 | 8/2011 | Callegari |
| 7,996,154 B2 | 8/2011 | Zuo et al. |
| 8,005,658 B2 | 8/2011 | Tilke et al. |
| 8,050,892 B2 | 11/2011 | Hartman |
| 8,078,437 B2 | 12/2011 | Wu et al. |
| 8,095,345 B2 | 1/2012 | Hoversten |
| 8,095,349 B2 | 1/2012 | Kelkar et al. |
| 8,145,464 B2 | 3/2012 | Arengaard et al. |
| 8,190,405 B2 | 5/2012 | Appleyard |
| 8,204,726 B2 | 6/2012 | Lee et al. |
| 8,204,727 B2 | 6/2012 | Dean et al. |
| 8,209,202 B2 | 6/2012 | Narayanan et al. |
| 8,212,814 B2 | 7/2012 | Branets et al. |
| 8,249,842 B2 | 8/2012 | Ghorayeb et al. |
| 8,255,195 B2 | 8/2012 | Yogeswarent |
| 8,271,248 B2 | 9/2012 | Pomerantz et al. |
| 8,275,589 B2 | 9/2012 | Montaron et al. |
| 8,275,593 B2 | 9/2012 | Zhao |
| 8,280,635 B2 | 10/2012 | Ella et al. |
| 8,280,709 B2 | 10/2012 | Koutsabeloulis et al. |
| 8,285,532 B2 | 10/2012 | Zangl et al. |
| 8,301,426 B2 | 10/2012 | Abasov et al. |
| 8,301,429 B2 | 10/2012 | Hajibeygi et al. |
| 8,315,845 B2 | 11/2012 | Lepage |
| 8,335,677 B2 | 12/2012 | Yeten et al. |
| 8,339,396 B2 | 12/2012 | Williams et al. |
| 8,350,851 B2 | 1/2013 | Flew et al. |
| 8,359,184 B2 | 1/2013 | Massonnat |
| 8,359,185 B2 | 1/2013 | Pita et al. |
| 8,374,974 B2 | 2/2013 | Chen et al. |
| 8,386,227 B2 | 2/2013 | Fung et al. |
| 8,401,832 B2 | 3/2013 | Ghorayeb et al. |
| 8,412,501 B2 | 4/2013 | Oury et al. |
| 8,412,502 B2 * | 4/2013 | Moncorge et al. ............... 703/10 |
| 8,423,338 B2 | 4/2013 | Ding et al. |
| 8,428,919 B2 | 4/2013 | Parashkevov |
| 8,429,671 B2 | 4/2013 | Wood et al. |
| 8,433,551 B2 | 4/2013 | Fung et al. |
| 8,437,999 B2 | 5/2013 | Pita et al. |
| 8,447,525 B2 | 5/2013 | Pepper |
| 8,452,580 B2 | 5/2013 | Strebelle |
| 8,457,940 B2 | 6/2013 | Xi et al. |
| 8,463,586 B2 | 6/2013 | Mezghani et al. |
| 8,484,004 B2 | 7/2013 | Schottle et al. |
| 8,489,375 B2 | 7/2013 | Omeragic et al. |
| 8,494,828 B2 | 7/2013 | Wu et al. |
| 8,498,852 B2 | 7/2013 | Xu et al. |
| 8,504,341 B2 | 8/2013 | Cullick et al. |
| 8,510,242 B2 | 8/2013 | Al-Fattah |

(56) References Cited

U.S. PATENT DOCUMENTS

| | | |
|---|---|---|
| 8,515,678 B2 | 8/2013 | Pepper et al. |
| 8,515,720 B2 | 8/2013 | Koutsabeloulis et al. |
| 8,515,721 B2 | 8/2013 | Morton et al. |
| 8,521,496 B2 | 8/2013 | Schottle et al. |
| 8,532,967 B2 | 9/2013 | Torrens et al. |
| 8,532,969 B2 | 9/2013 | Li et al. |
| 8,543,364 B2 | 9/2013 | Liu et al. |
| 8,577,660 B2 | 11/2013 | Wendt et al. |
| 8,583,411 B2 | 11/2013 | Fung |
| 8,589,135 B2 | 11/2013 | Middya et al. |
| 8,599,643 B2 | 12/2013 | Pepper et al. |
| 8,606,524 B2 | 12/2013 | Soliman et al. |
| 8,612,194 B2 | 12/2013 | Horne et al. |
| 8,630,831 B2 | 1/2014 | Bratvedt et al. |
| 8,635,026 B2 | 1/2014 | Ameen |
| 8,639,444 B2 | 1/2014 | Pepper et al. |
| 8,655,632 B2 | 2/2014 | Moguchaya |
| 8,674,984 B2 | 3/2014 | Ran et al. |
| 8,676,557 B2 | 3/2014 | Ding et al. |
| 8,686,996 B2 | 4/2014 | Cheung et al. |
| 8,688,424 B2 | 4/2014 | Bourbiaux et al. |
| 8,694,261 B1 | 4/2014 | Robinson |
| 8,700,549 B2 | 4/2014 | Hossain et al. |
| 8,712,746 B2 | 4/2014 | Tillier et al. |
| 8,712,747 B2 | 4/2014 | Cullick et al. |
| 8,718,958 B2 | 5/2014 | Breton et al. |
| 8,718,993 B2 | 5/2014 | Klie |
| 8,731,887 B2 | 5/2014 | Hilliard et al. |
| 8,731,891 B2 | 5/2014 | Sung et al. |
| 8,738,294 B2 | 5/2014 | Ameen |
| 8,762,442 B2 | 6/2014 | Jeong et al. |
| 8,775,141 B2 | 7/2014 | Raphael |
| 8,775,144 B2 | 7/2014 | Han et al. |
| 8,776,895 B2 | 7/2014 | Li et al. |
| 8,780,671 B2 | 7/2014 | Sayers |
| 8,793,111 B2 | 7/2014 | Tilke et al. |
| 8,797,319 B2 | 8/2014 | Lin |
| 8,798,974 B1 | 8/2014 | Nunns |
| 8,798,977 B2 | 8/2014 | Hajibeygi et al. |
| 8,803,878 B2 | 8/2014 | Andersen et al. |
| 8,805,660 B2 | 8/2014 | Güyagüler et al. |
| 8,812,334 B2 | 8/2014 | Givens et al. |
| 8,818,778 B2 | 8/2014 | Salazar-Tio et al. |
| 8,818,780 B2 | 8/2014 | Calvert et al. |
| 8,843,353 B2 | 9/2014 | Posamentier et al. |
| 8,855,986 B2 | 10/2014 | Castellini et al. |
| 8,862,450 B2 | 10/2014 | Derfoul et al. |
| 8,874,804 B2 | 10/2014 | AlShaikh et al. |
| 8,898,017 B2 | 11/2014 | Kragas et al. |
| 8,903,694 B2 | 12/2014 | Wallis et al. |
| 8,935,141 B2 | 1/2015 | Ran et al. |
| 2002/0049575 A1 | 4/2002 | Jalali et al. |
| 2005/0171700 A1 | 8/2005 | Dean |
| 2006/0036418 A1 | 2/2006 | Pita et al. |
| 2006/0122780 A1 | 6/2006 | Cohen et al. |
| 2006/0184329 A1 | 8/2006 | Rowan et al. |
| 2006/0265204 A1 | 11/2006 | Wallis et al. |
| 2006/0269139 A1 | 11/2006 | Keskes et al. |
| 2007/0016389 A1 | 1/2007 | Ozgen |
| 2007/0277115 A1 | 11/2007 | Glinsky et al. |
| 2007/0279429 A1 | 12/2007 | Ganzer et al. |
| 2007/0282582 A1 | 12/2007 | Saaf |
| 2008/0126168 A1 | 5/2008 | Carney et al. |
| 2008/0133550 A1 | 6/2008 | Orangi et al. |
| 2008/0144903 A1 | 6/2008 | Wang et al. |
| 2008/0234988 A1 | 9/2008 | Chen et al. |
| 2008/0306803 A1 | 12/2008 | Vaal et al. |
| 2009/0055141 A1 | 2/2009 | Moncorge et al. |
| 2009/0071239 A1 | 3/2009 | Rojas et al. |
| 2009/0122061 A1 | 5/2009 | Hammon, III |
| 2009/0248373 A1 | 10/2009 | Druskin et al. |
| 2010/0132450 A1 | 6/2010 | Pomerantz et al. |
| 2010/0138196 A1 | 6/2010 | Hui et al. |
| 2010/0161300 A1 | 6/2010 | Yeten et al. |
| 2010/0179797 A1 | 7/2010 | Cullick et al. |
| 2010/0185428 A1 | 7/2010 | Vink |
| 2010/0191516 A1 | 7/2010 | Benish et al. |
| 2010/0286971 A1 | 11/2010 | Middya et al. |
| 2010/0307755 A1 | 12/2010 | Xu et al. |
| 2010/0312535 A1 | 12/2010 | Chen et al. |
| 2010/0324873 A1 | 12/2010 | Cameron |
| 2011/0004447 A1 | 1/2011 | Hurley et al. |
| 2011/0015910 A1 | 1/2011 | Ran et al. |
| 2011/0040533 A1 | 2/2011 | Torrens et al. |
| 2011/0046927 A1 | 2/2011 | Jeong et al. |
| 2011/0054857 A1 | 3/2011 | Moguchaya |
| 2011/0054869 A1 | 3/2011 | Li et al. |
| 2011/0082676 A1 | 4/2011 | Bratvedt et al. |
| 2011/0106514 A1 | 5/2011 | Omeragic et al. |
| 2011/0115787 A1 | 5/2011 | Kadlec |
| 2011/0161133 A1 | 6/2011 | Staveley et al. |
| 2011/0251830 A1 | 10/2011 | Hilliard et al. |
| 2011/0310101 A1 | 12/2011 | Prange et al. |
| 2011/0313745 A1 | 12/2011 | Mezghani et al. |
| 2012/0059590 A1 | 3/2012 | Ameen |
| 2012/0059640 A1 | 3/2012 | Roy et al. |
| 2012/0065951 A1 | 3/2012 | Roy et al. |
| 2012/0136641 A1 | 5/2012 | Fung et al. |
| 2012/0143577 A1 | 6/2012 | Szyndel et al. |
| 2012/0150506 A1 | 6/2012 | Han et al. |
| 2012/0150518 A1 | 6/2012 | Güyagüler et al. |
| 2012/0158389 A1 | 6/2012 | Wu et al. |
| 2012/0159124 A1 | 6/2012 | Hu et al. |
| 2012/0173220 A1 | 7/2012 | Li et al. |
| 2012/0179436 A1 | 7/2012 | Fung |
| 2012/0203515 A1 | 8/2012 | Pita et al. |
| 2012/0215512 A1 | 8/2012 | Sarma |
| 2012/0215513 A1 | 8/2012 | Branets et al. |
| 2012/0221303 A1 | 8/2012 | Wallis et al. |
| 2012/0232589 A1 | 9/2012 | Pomerantz et al. |
| 2012/0232799 A1 | 9/2012 | Zuo et al. |
| 2012/0232859 A1 | 9/2012 | Pomerantz et al. |
| 2012/0232861 A1 | 9/2012 | Lu et al. |
| 2012/0232865 A1 | 9/2012 | Maucec et al. |
| 2012/0265512 A1 | 10/2012 | Hu et al. |
| 2012/0271609 A1 | 10/2012 | Laake et al. |
| 2012/0296617 A1 | 11/2012 | Zuo et al. |
| 2013/0030777 A1 | 1/2013 | Sung et al. |
| 2013/0030782 A1 | 1/2013 | Yogeswaren |
| 2013/0035913 A1 | 2/2013 | Mishev et al. |
| 2013/0041633 A1 | 2/2013 | Hoteit |
| 2013/0046524 A1 | 2/2013 | Gathogo et al. |
| 2013/0054201 A1 | 2/2013 | Posamentier et al. |
| 2013/0073268 A1 | 3/2013 | Abacioglu et al. |
| 2013/0085730 A1 | 4/2013 | Shaw et al. |
| 2013/0090907 A1 | 4/2013 | Maliassov |
| 2013/0096890 A1 | 4/2013 | Vanderheyden et al. |
| 2013/0096898 A1 | 4/2013 | Usadi et al. |
| 2013/0096899 A1 | 4/2013 | Usadi et al. |
| 2013/0096900 A1 | 4/2013 | Usadi et al. |
| 2013/0110484 A1 | 5/2013 | Hu et al. |
| 2013/0112406 A1 | 5/2013 | Zuo et al. |
| 2013/0116993 A1 | 5/2013 | Maliassov |
| 2013/0118736 A1 | 5/2013 | Usadi et al. |
| 2013/0124097 A1 | 5/2013 | Thorne |
| 2013/0124173 A1 | 5/2013 | Lu et al. |
| 2013/0138412 A1 | 5/2013 | Shi et al. |
| 2013/0151159 A1 | 6/2013 | Pomerantz et al. |
| 2013/0166264 A1 | 6/2013 | Usadi et al. |
| 2013/0185033 A1 | 7/2013 | Tompkins et al. |
| 2013/0204922 A1 | 8/2013 | El-Bakry et al. |
| 2013/0231907 A1 | 9/2013 | Yang et al. |
| 2013/0231910 A1 | 9/2013 | Kumar et al. |
| 2013/0245949 A1 | 9/2013 | Abitrabi et al. |
| 2013/0246031 A1 | 9/2013 | Wu et al. |
| 2013/0289961 A1 | 10/2013 | Ray et al. |
| 2013/0304679 A1 | 11/2013 | Fleming et al. |
| 2013/0311151 A1 | 11/2013 | Plessix |
| 2013/0312481 A1 | 11/2013 | Pelletier et al. |
| 2013/0332125 A1 | 12/2013 | Suter et al. |
| 2013/0338985 A1 | 12/2013 | Garcia et al. |
| 2014/0012557 A1 | 1/2014 | Tarman et al. |
| 2014/0166280 A1 | 6/2014 | Stone et al. |

(56) References Cited

U.S. PATENT DOCUMENTS

| | | |
|---|---|---|
| 2014/0201450 A1 | 7/2014 | Haugen |
| 2014/0214388 A1 | 7/2014 | Gorell |
| 2014/0236558 A1 | 8/2014 | Maliassov |

FOREIGN PATENT DOCUMENTS

| | | |
|---|---|---|
| WO | 99/28767 | 6/1999 |
| WO | 2007/022289 | 2/2007 |
| WO | 2007/116008 | 10/2007 |
| WO | 2009/138290 | 11/2009 |
| WO | 2013/180709 | 12/2013 |
| WO | 2013/184190 | 12/2013 |
| WO | 2013/187915 | 12/2013 |
| WO | 2014/027196 | 2/2014 |
| WO | 2014/051903 | 4/2014 |
| WO | 2014/171947 | 10/2014 |
| WO | 2014/185898 | 11/2014 |
| WO | 2014/185950 | 11/2014 |

OTHER PUBLICATIONS

Gai, X. et al. (2005), "A Timestepping Scheme for Coupled Reservoir Flow and Geomechancis in Nonmatching Grids," *SPE 97054, 2005 SPE Annual Tech. Conf. and Exh.*, pp. 1-11.

Klie, H. et al. (2005), "Krylov-Secant Methods for Accelerating the Solution of Fully Implicit Formulations," *SPE 92863, 2005 SPE Reservoir Simulation Symposium*, 9 pgs.

Lu, B. et al. (2007), "Iteratively Coupled Reservoir Simulation for Multiphase Flow," *SPE 110114, 2007 SPE Annual Tech. Conf. and Exh.*, pp. 1-9.

Mosqueda, G. et al. (2007), "Combined Implicit or Explicit Integration Steps for Hybrid Simulation," *Earthquake Engng. & Struct. Dyn.* 36(15), pp. 2325-2343.

Younis, R.M. et al. (2009), "Adaptively-Localized-Continuation-Newton: Reservoir Simulation Nonlinear Solvers that Converge All the Time," *SPE 119147, 2009 SPE Reservoir Simulation Symposium*.

Aarnes, J. et al. (2004), "Toward reservoir simulation on geological grid models", 9$^{th}$ European Conf. on the Mathematics of Oil Recovery, 8 pgs.

Ahmadizadeh, M., et al., (2007), "Combined Implicit or Explicit Integration Steps For Hybrid Simulation", *Structural Engineering Research Frontiers*, pp. 1-16.

Bortoli, L. J., et al., (1992), "Constraining Stochastic Images to Seismic Data", Geostatistics, Troia, *Quantitative Geology and Geostatistics* 1, 325-338.

Byer, T.J., et al., (1998), "Preconditioned Newton Methods For Fully Coupled Reservoir and Surface Facility Models", *SPE 49001, 1998 SPE Annual Tech. Conf., and Exh.*, pp. 181-188.

Candes, E. J., et al., (2004), "New Tight Frames of Curvelets and Optimal Representations of Objects with C$^2$ Singularities," *Communications on Pure and Applied Mathematics* 57, 219-266.

U.S. Appl. No. 14/461,193, Aug. 15, 2014, Casey.
U.S. Appl. No. 62/081,159, Nov. 18, 2014, Branets, et al.
U.S. Appl. No. 62/073,462, Oct. 31, 2014, Bi, et al.
U.S. Appl. No. 62/033,529, Aug. 5, 2014, Casey.
U.S. Appl. No. 62/031,097, Jul. 30, 2014, Branets, et al.

Chen, Y. et al. (2003), "A coupled local-global upscaling approach for simulating flow in highly heterogeneous formations", Advances in Water Resources 26, pp. 1041-1060.

Connolly, P., (1999), "Elastic Impedance," *The Leading Edge* 18, 438-452.

Crotti, M.A. (2003), "Upscaling of Relative Permeability Curves for Reservoir Simulation: an Extension to Areal Simulations Based on Realistic Average Water Saturations", SPE 81038, SPE Latin American and Caribbean Petroleum Engineering Conf., 6 pgs.

Donoho, D. L., Hou, X., (2002), "Beamlets and Multiscale Image Analysis," *Multiscale and Multiresolution Methods, Lecture Notes in Computational Science and Engineering* 20, 149-196.

Durlofsky, L.J. (1991), "Numerical Calculation of Equivalent Grid Block Permeability Tensors for Heterogeneous Porous Media", *Water Resources Research* 27(5), pp. 699-708.

Farmer, C.L. (2002), "Upscaling: a review", *Int'l. Journal for Numerical Methods in Fluids* 40, pp. 63-78.

Gai, X., et al., (2005), "A Timestepping Scheme for Coupled Reservoir Flow and Geomechanics in Nonmatching Grids", *SPE 97054, 2005 SPE Annual Tech. Conf and Exh.*, pp. 1-11.

Haas, A., et al., (1994), "Geostatistical Inversion—A Sequential Method of Stochastic Reservoir Modeling Constrained by Seismic Data," *First Break* 12, 561-569.

Hess, M. A., (2008), "Company Multiscale Finite vol. Method for Heterogeneous Anisotropic Elliptic Equations", *Multiscale Model Simul.* vol. 7 No. 2, pp. 934-962.

Holden, L. et al. (1992), "A Tensor Estimator for the Homogenization of Absolute Permeability", *Transport in Porous Media* 8, pp. 37-46.

Isaaks, E. H., et al., (1989), "Applied Geostatistics", *Oxford University Press*, New York, pp. 40-65.

Journel, A., (1992), "Geostatistics: Roadblocks and Challenges," *Geostatistics, Troia '92: Quanititative Geoglogy and Geostatistics* 1, 213-224.

Klie, H., et al., (2005), "Krylov-Secant Methods for Accelerating the Solution of Fully Implicit Formulations", *SPE 92863, 2005 Spe Reservoir Simulation Symposium*, 9 pgs.

Lu, B., et al., (2007), "Iteratively Coupled Reservoir Simulation for Multiphase Flow", *SPE 110114, 2007 SPE Annual Tech. Conf and Exh.*, pp. 1-9.

Mallat, S., (1999), "A Wavelet Tour of Signal Processing", *Academic Press*, San Diego, pp. 80-91.

Mosqueda, G., et al., (2007), "Combined Implicit or Explicit Integration Steps for Hybrid Simulation", *Earthquake Engng. & Struct. Dyn.*, vol. 36(15), pp. 2325-2343.

Qi, D. et al. (2001), "An Improved Global Upscaling Approach for Reservoir Simulation", *Petroleum Science and Technology* 19(7&8), pp. 779-795.

Strebelle, S., (2002), "Conditional simulations of complex geological structures using multiple-point statistics," *Mathematical Geology* 34(1), 1-21.

Sweldens, W., (1998), "The Lifting Scheme: a Construction of Second Generation Wavelets," *SIAM Journal on Mathematical Analysis* 29, 511-546.

Verly, G., (1991), "Sequential Gaussian Simulation: a Monte Carlo Approach for Generating Models of Porosity and Permeability," Special Publication No. 3 of EAPG—Florence 1991 Conference, Ed.: Spencer, A.M.

Whitcombe, D. N., et al., (2002), "Extended elastic impedance for fluid and lithology prediction," *Geophysics* 67, 63-67.

White, C.D. et al. (1987), "Computing Absolute Transmissibility in the Presence of Fine-Scale Heterogeneity", Spe 16011, 9$^{th}$ SPE Symposium in Reservoir Simulation, pp. 209-220.

Wu, X.H. et al. (2007), "Reservoir Modeling with Global Scaleup", SPE 105237, 15$^{th}$ SPE Middle East Oil & Gas Show & Conf., 13 pgs.

Yao, T., et al., (2004), "Spectral Component Geologic Modeling: a New Technology for Integrating Seismic Information at the Correct Scale," Geostatistics Banff, *Quantitative Geology & Geostatistics* 14, pp. 23-33.

Younis, R.M., et al., (2009), "Adaptively-Localized-Continuation-Newton: Reservoir Simulation Nonlinear Solvers That Converge All the Time", *SPE 119147, 2009 SPE Reservoir Simulation Symposium*, pp. 1- 21.mos.

Zhang T., et al., (2006), "Filter-based classification of training image patterns for spatial Simulation," *Mathematical Geology* 38, 63-80.

\* cited by examiner

| Iteration 1 | Computation Cost | Conventional Newton | Conventional AIM | Adaptive Newton | Flexible & Adaptive |
|---|---|---|---|---|---|
| 1 | # of Active Cells | 169 | 169 | 169 | 169 |
| | # of Implicit Cells | 169 | 30 | 169 | 30 |
| | # of Equations | 507 | 229 | 507 | 229 |
| 2 | # of Active Cells | 169 | 169 | 88 | 88 |
| | # of Implicit Cells | 169 | 30 | 88 | 30 |
| | # of Equations | 507 | 229 | 264 | 148 |
| 3 | # of Active Cells | 169 | 169 | 39 | 57 |
| | # of Implicit Cells | 169 | 30 | 39 | 31 |
| | # of Equations | 507 | 229 | 117 | 119 |
| Total Equations Solved | | 1521 | 687 (Time Cut) | 888 | 496 |

FLEXIBLE AND ADAPTIVE FORMULATIONS FOR COMPLEX RESERVOIR SIMULATIONS

CROSS-REFERENCE TO RELATED APPLICATION

This application claims the benefit of U.S. Provisional Patent Application 61/384,557 filed Sep. 20, 2010 entitled FLEXIBLE AND ADAPTIVE FORMULATIONS FOR COMPLEX RESERVOIR SIMULATIONS, the entirety of which is incorporated by reference herein.

FIELD OF THE INVENTION

Disclosed aspects and methodologies relate to reservoir simulation, and more particularly, to methods of solving multiple fluid flow equations.

BACKGROUND

This section is intended to introduce various aspects of the art, which may be associated with aspects of the disclosed techniques and methodologies. A list of references is provided at the end of this section and may be referred to hereinafter. This discussion, including the references, is believed to assist in providing a framework to facilitate a better understanding of particular aspects of the disclosure. Accordingly, this section should be read in this light and not necessarily as admissions of prior art.

Reservoir simulators solve systems of equations describing the flow of oil, gas and water within subterranean formations. In a reservoir simulation model, the subterranean formation is mapped on to a two- or three-dimensional grid comprising a plurality of cells. Each cell has an associated equation set that describes the flow into the cell, the flow out of the cell, and the accumulation within the cell. For example, if the reservoir is divided into 1000 cells, there will be 1000 equation sets that need to be solved.

To model the time-varying nature of fluid flow in a hydrocarbon reservoir, the solution of the equations to be solved on the grid cells varies over time. In the reservoir simulator, solutions are determined at discrete times. The time interval between solutions is called the timestep. For example, the reservoir simulator may calculate the pressures and saturations occurring at the end of a month, so the timestep is a month and a single solution to the equation set is needed. To calculate the changes in pressure and saturation over a year, the simulator in this example calculates twelve monthly solutions. The time spent solving this problem is roughly twelve times the time spent solving the single month problem.

The size of the timestep that a simulator can take depends on a number of factors. One factor is the numerical method employed to find the solution. As some reservoir models may have thousands or millions of cells, various methods have been proposed to efficiently solve the large number of equations to be solved by a reservoir simulation model. One known strategy for finding the solutions to these systems of equations is to use an iterative root-finding method. These methods find approximate solutions that get progressively closer to the true solution through iteration and solution updating. Newton's Method is one type of iterative root-finding method in general use. In Newton's Method, the set of simulation equations are cast into a form that makes the solution an exercise in finding the zeros of a function, i.e. finding x such that $f(x)=0$.

FIG. 1 is a graph 8 that depicts Newton's Method for a single equation. Curve 10 is the function $f(x)$. What is sought is the value x where $f(x)=0$, indicated by point 12. The initial guess is $x_0$. The second guess is calculated by taking the line 14 tangent to $f(x)$ at $x_0$ and applying the formula $x_1=x_0-(f(x_0)/f'(x_0))$. Here $f'(x)$ denotes the derivative of the function $f(x)$ and is the slope of the tangent line at x. The third guess, $x_2$, uses the line 16 tangent at the second guess ($x_1$) and applies the same formula, $x_2=x_1-(f(x_1)/f'(x_1))$. Continuing this iterative algorithm one can get very close to the root of $f(x)$, i.e., point 12, in a modest number of iterations. If the curve $f(x)$ is well-behaved, quadratic convergence can be achieved.

Reservoir simulators have expanded Newton's Method to solve for the many thousands of equations at each timestep. Instead of one equation a system of equations is used:

$$f_1(x_1, \ldots, x_n) = 0$$
$$f_2(x_1, \ldots, x_n) = 0$$
$$\vdots$$
$$f_n(x_1, \ldots, x_n) = 0$$

[Equation 1]

where $f_1(x_1, \ldots, x_n)=0$ are the reservoir simulation equations for grid block 1 containing the variables $x_1$ through $x_n$, and n is the number of grid cells. The variables, $x_1, \ldots, x_n$, are typically pressures and saturations at each cell.

To apply Newton's method to this system of equations the tangent of the function is needed at each iteration, like that described above for the single equation above. The tangent of this matrix A is called the Jacobian J and is composed of the derivatives of the functions with respect to the unknowns.

$$J = \begin{bmatrix} \frac{\partial f_1}{\partial x_1} & \cdots & \frac{\partial f_1}{\partial x_n} \\ \vdots & \ddots & \vdots \\ \frac{\partial f_n}{\partial x_1} & \cdots & \frac{\partial f_n}{\partial x_n} \end{bmatrix}$$

[Equation 2]

As in the case with one equation an initial guess $\vec{x}_0$ is made, where $\vec{x}_0$ is a vector of solutions. Each subsequent guess is formed in the same manner as that for a single variable, where $\vec{x}_i$ is formed from the previous guess $\vec{x}_{i-1}$ using the following equation:

$$\vec{x}_i = \vec{x}_{i-1} - (f(\vec{x}_{i-1})/J(\vec{x}_{i-1}))$$

[Equation 3]

This equation can be rewritten as $$J(\vec{x}_{i-1})(\vec{x}_i - \vec{x}_{i-1}) = -f(\vec{x}_{i-1})$$

[Equation 4]

which is a matrix equation of the form $A\vec{x}=\vec{b}$. The solution is thought to be converged when either the term $(\vec{x}_i - \vec{x}_{i-1})$ or $-f(\vec{x}_i)$ approaches zero, i.e. is below a small threshold, epsilon ($\epsilon$). This idea is applied to each of the thousands or millions of cells over hundreds of timesteps in a reservoir simulator.

FIG. 2 is a flowchart 20 showing the steps of Newton's Method for a system of equations. At block 21, a solution vector $\vec{x}_i$, representing the solutions for the system of equations, is set to an initial guess $\vec{x}_0$. At block 22 a Jacobian Matrix $J_i$ and a vector $\vec{b}_i$ is constructed for all cells $Z_n$, or equation sets associated with the cells, using the solution vector $\vec{x}_i$. At block 23 a new solution estimate $\vec{x}_{i1}$ is obtained for all cells $Z_n$. At block 24 it is determined how many cells are not converged, which may be defined as having associated equation sets that have not satisfied a convergence criterion. If the number of unconverging cells is zero, then at block 25 the method stops. However, if at block 26 it is determined that the number of unconverging cells is not zero, then at block 27 the solution guess vector $\vec{x}_i$ is set to the new solution estimate $\vec{x}_{i1}$, and the process returns to block 22. The method repeats until all cells are converged. At that point the system of equations may be considered solved.

While the Newton's Method provides a simple way to iteratively solve for solutions to systems of nonlinear equations, its effectiveness is lessened when the equations in a system of equations do not uniformly converge. For example, a two-dimensional grid 30 is shown in FIGS. 3A, 3B, 3C, and 3D as having 169 cells. Each cell has an equation or equation set associated therewith. Prior to any iteration (FIG. 3A) the 169 equations are used as inputs to Newton's Method. After one iteration of Newton's Method (FIG. 3B) the equations related to 111 cells have converged (shown by the lighter-colored cells 32). In other words, some areas of the reservoir have found solutions such that the term $(\vec{x}_i - \vec{x}_{i-1})$ is below $\epsilon$ for those areas. The unconverged cells are shown as darker colored cells 34. The second iteration (FIG. 3C) uses all 169 equations, and the equations related to 147 cells have converged thereafter (as indicated by reference number 36). After the third iteration (FIG. 3D)—which also uses all 169 equations—is completed, all equations have converged. This example highlights a drawback of Newton's Method: even though most equations have converged to a solution after a single iteration, Newton's Method uses the equations for all cells for all iterations. In other words, the size of the system of equations to be solved does not change after each iteration. For a large two- or three-dimensional reservoir simulation grid having thousands or millions of cells, the time and computational power required to perform Newton's Method repeatedly may be prohibitive.

In general, the linear system constructed by Newton's method is very large and expensive to solve for typical reservoir simulation models with complex geological structures and difficult physical properties. While maintaining numerical stability, fully implicit schemes employing the Newton's Method require substantial CPU time and a large memory footprint. More explicit schemes are cheaper in CPU time per timestep, but have difficulty taking viable time steps with reasonable sizes, given their stability limits. The Adaptive Implicit Method (AIM) is a natural choice to balance implicitness/stability and CPU/memory footprint. The basic concept of AIM is to combine multiple formulations with different degrees of implicitness. Therefore, the simulation can use a fully implicit formulation (e.g., solving pressure and saturations at the same time) to maintain unconditional stability for cells with constraining stability, while using cheaper and more explicit formulations (e.g., solving pressure only, explicitly updating saturation solutions afterwards) for the remainder of the reservoir. This type of strategy is known as IMplicit Pressure Explicit Saturation (IMPES). AIM reduces the size of the Jacobian matrix without sacrificing the numerical stability and timestep sizes. AIM relies heavily on robust stability estimation and prediction to determine how to distribute reservoir simulation cells into different formulations, i.e., potentially unstable cells in the implicit region, and less stable cells in the explicit region.

FIGS. 4A-4C show an example of how the Adaptive Implicit Method may be applied in a reservoir simulator. A 17×17 reservoir simulation grid 40 is depicted at a particular timestep, demonstrating a five-spot water injection pattern with a water injector at the upper-left corner 41 and a producer at the lower-right corner 42. FIG. 4A is the map of water saturation at the given timestep with arrow 43 indicating the direction of the water front movement. The degree of shading of each cell indicates the amount of water saturation therein. FIG. 4B graphically illustrates relative stability at each cell at the beginning of the timestep with shaded cells 44 denoted as unstable. These cells 44 are assigned to be solved implicitly. The stability of each cell will be recalculated at the end of the timestep, which is shown in FIG. 4C. As the water front moves during the timestep, the stability at each cell may change, and this is shown in FIG. 4C as a different group of cells 45 being denoted as unstable. This group of unstable cells 45 is assigned to be solved implicitly for the next timestep.

A typical AIM scheme will preset the implicit/explicit formulations at the beginning of each timestep using the stability information calculated from previous timestep. Although the reservoir model contains multiple formulations, the formulation on any given cell will remain the same throughout the timestep, This approach has a few potential issues. First, all the stability criteria have been derived from linearized systems. For highly nonlinear systems, the stability criteria are not very robust and reliable, e.g., as in thermal recovery processes. Second, the stability limits are calculated at the beginning of each timestep. The situation often arises that a cell was stable according to the stability calculation and put into the explicit region, but by the end of the timestep the cell is not stable any more because of the nonlinear nature of the problem, as shown in FIGS. 4B-4C. For example, one of the commonly used stability criteria is expressed as the CFL (Courant-Friedrichs-Lewy) number, and the stability condition for IMPES formulation is CFL<1. In a simplified two-phase oil-water simulation model, the CFL number can be expressed as $$CFL = \frac{q_T \Delta t}{V_p} \frac{dF_w(S_w)}{dS_w} \qquad \text{[Equation 5]}$$

where $\Delta t$ is the timestep size, $q_T \Delta t / V_p$ the volumetric throughput, and $F_w(S_w)$ is the fractional flow, which is a function of water saturation $S_w$ according to $$F_w(S_w) = \frac{\lambda_w}{\lambda_w + \lambda_o} \qquad \text{[Equation 6]}$$

where $\lambda_w$, $\lambda_o$ are water and oil mobility respectively. If a cell has a low CFL number (less than 1, for example) at a given timestep, it is assumed that cell is stable, and an explicit formulation is used to solve the flow equations at that timestep. If a cell has a high CFL number (greater than 1, for example) at a given timestep, it is assumed the cell is unstable, and an implicit formulation is used to solve the flow equations at the timestep. FIG. 5 shows a graphic representation of how the CFL number is calculated for a simulation cell. $F_w'(S_w)$ is the derivative of the function $F_w(S_w)$ 50 which is the slope of the tangent line at any given point. With a given timestep size and fixed volumetric throughput, the CFL number is proportional to this derivative as expressed in Equation 5. The fractional flow $F_{w1}(S_{w1})$ at the beginning of the timestep (with water saturation $S_{w1}$) has a CFL number just within the stability bound, represented by the relatively flat slope of tangent line 51, and dictates an explicit formulation. The fractional flow $F_{w2}$ ($S_{w2}$) at the end of the timestep (with water saturation $S_{w2}$) has a CFL number much larger than the stability bound, represented by the steep slope of tangent line 52, and may cause a numerical stability issue.

Several strategies may be used to remedy this stability issue, but each strategy imposes unwanted costs on the simulation. A conservative CFL limit may be used, but this may impose a more stringent timestep constraint on the simulation run, or distribute too many simulation cells into the implicit formulation. The timestep may be rerun with the unstable cells being switched to the implicit formulation, but for large and highly nonlinear systems this approach will inevitably incur unnecessary calculations and slow down the simulation. A timestep cut could be triggered to satisfy the stability limit, but this would increase the number of calculations to solve the simulation. Finally, a small amount of unstable cells may be permitted to be run in the simulation, assuming that the local instability will dissipate and disappear eventually. This approach sacrifices numerical stability for simulation runtime performance.

Another potential inefficiency of the AIM method could be aggravated if a conservative CFL limit is used. A cell might require a fully implicit scheme at the beginning of a timestep. However, the particular cell could quickly converge to a solution that is well within the stability limit. As FIG. 5 shows, the CFL number at the end of another timestep (with water saturation $S_{w3}$), represented by the relatively flat slope of tangent line 53 could be much lower than the beginning of the timestep (with water saturation $S_{w2}$), represented by the steep slope of tangent line 52. Assigning the associated simulation cell to an implicit formulation scheme will likely over-constrain either the timestep size or the computational scheme.

Various attempts have been made to reduce the time required to solve a system of equations using implicit or adaptive implicit methods. Examples of these attempts are found in the following: U.S. Pat. Nos. 6,662,146, 6,052,520, 7,526,418, 7,286,972, and 6,230,101; U.S. Patent Application No. 2009/0055141; "Krylov-Secant Methods for Accelerating the Solution of Fully Implicit Formulations" (SPE Journal, Paper No. 00092863); "Adaptively-Localized-Continuation-Newton: Reservoir Simulation Nonlinear Solvers that Converge All the Time" (SPE Journal, Paper No. 119147); "Preconditioned Newton Methods for Fully Coupled Reservoir and Surface Facility Models" (SPE Journal, Paper No. 00049001); Gai, et al., "A Timestepping Scheme for Coupled Reservoir Flow and Geomechanics on Nonmatching Grids" (SPE Journal, Paper No. 97054); Lu, et al., "Iteratively Coupled Reservoir Simulation for Multiphase Flow" (SPE Journal, Paper No. 110114); and Mosqueda, et al., "Combined Implicit or Explicit Integration Steps for Hybrid Simulation", Earthquake Engineering and Structural Dynamics, vol. 36 no. 15, pp 2325-2343 (2007). While each of these proposed methods may reduce the time necessary to solve a system of equations, none of the methods reduce the number of equations (or cells) required to be solved using an implicit method employing Newton's Method. Furthermore, none of the references disclose a change in formulation method during a timestep. What is needed is a way to reduce the number of equations needed to be solved in successive iterations of an iterative solver.

SUMMARY

In one aspect, a method is provided for performing a simulation of a subsurface hydrocarbon reservoir. The reservoir is approximated by a reservoir model having a plurality of cells. Each cell has associated therewith an equation set representing a reservoir property. A stability limit is determined for each of the plurality of cells. Each cell is assigned to one of an explicit formulation or an implicit formulation. An initial guess is provided to a solution for a system of equations formed using the equation set for each cell in the plurality of cells. The initial guess is used to solve for a solution to the system of equations using an explicit formulation for cells assigned thereto and an implicit formulation for cells assigned thereto. A list of unconverged cells is established. The unconverged cells have equation sets that have not satisfied a convergence criterion. A stability limit is calculated for each of the converged cells. The converged cells have equation sets that have satisfied the convergence criterion. When the number of unconverged cells is greater than a predetermined amount, a reduced nonlinear system is constructed with the list of unconverged cells. The reduced nonlinear system is assigned to be solved with the implicit formulation, and other cells are assigned to be solved with the explicit formulation. The using, establishing, calculating and constructing parts of the method are repeated, substituting the solved solution for the initial guess or the most recent solved solution and substituting the equation sets corresponding to the cells in the list of unconverged cells for the system of equations or equation sets from the most recent iteration, until all equation sets satisfy the convergence criterion and a stability criterion. When all equation sets satisfy the convergence criterion and the stability criterion, the solved solution is output as a result for a timestep of a simulation of the subsurface reservoir.

According to disclosed methodologies and techniques, an iterative root-finding method may be used with the initial guess to solve for the solution to the system of equations. The iterative root-finding method may comprise Newton's Method. Converged cells with one or more reservoir properties exhibiting changes greater than a preset amount may be added to the list of unconverged cells. Converged cells that do not satisfy the stability criterion may be added to the list of unconverged cells. Any cell that is neighbor to a cell in the list of unconverged cells and that does not satisfy the stability criterion may be added to the list of unconverged cells. The number of neighbor cells may be between 1 and N-W, where N is the number of the plurality of cells in the reservoir model and W is the number of cells having equation sets that satisfy the convergence criterion. Any cell that is neighbor to a cell in the list of unconverged cells and that does satisfy the stability criterion may be assigned to be solved using the explicit formulation. The reservoir property may be at least one of fluid pressure, fluid saturation, and fluid flow. Some or all of the method may be performed using a computer. Outputting the solved solution may include displaying the solved solution. The predetermined amount may be zero. A post-Newton material balance corrector may be employed when all equation sets satisfy the convergence criterion and the stability criterion. The post-Newton material balance corrector may employ an explicit molar update or total volumetric flux conservation.

According to other methodologies and techniques, the timestep of the simulation of the subsurface reservoir may be a first timestep, and some or all of the method may be repeated at additional timesteps. The solved solutions for the first timestep and the additional timesteps may be outputted. The solved solutions may simulate the subsurface reservoir over time.

In another aspect, a method is disclosed for performing a simulation of a subsurface hydrocarbon reservoir. The reservoir is approximated by a reservoir model having a plurality of cells. Each cell has associated therewith an equation set representing a reservoir property including at least one of fluid pressure, saturation, and fluid flow. A stability limit is determined for each of the plurality of cells. Each cell is assigned to an explicit formulation or an implicit formulation. An initial guess is provided to a solution for a system of equations formed using the equation set for each cell in the plurality of cells. The initial guess is used to solve for a solution to the system of equations using an explicit formulation for cells assigned thereto and an implicit formulation for cells assigned thereto. A list of unconverged cells is established. The unconverged cells have equation sets that have not satisfied a convergence criterion. A stability limit is calculated for each of the converged cells. The converged cells have equation sets that have satisfied the convergence criterion. When the number of unconverged cells is greater than a predetermined amount, the following are added to the list of unconverged cells: converged cells with one or more reservoir properties exhibiting changes greater than a preset amount; converged cells that do not satisfy the stability criterion; and any cell that is neighbor to a cell in the list of unconverged cells and that does not satisfy the stability criterion. A reduced nonlinear system is constructed with the list of unconverged cells. The reduced nonlinear system is assigned to be solved with the implicit formulation. Other cells are assigned to be solved with the explicit formulation. The using, establishing, calculating, and adding parts of the method are repeated, substituting the solved solution for the initial guess or the most recent solved solution and substituting the equation sets corresponding to the cells in the list of unconverged cells for the system of equations or equation sets from the most recent iteration, until all equation sets satisfy the convergence criterion and a stability criterion. When all equation sets satisfy the convergence criterion and the stability criterion, the solved solution is outputted as a result for a timestep of a simulation of the subsurface reservoir.

According to disclosed methodologies and techniques, part or all of the method may be repeated at additional timesteps, and the solved solutions for the first timestep and the additional timesteps may be outputted as a simulation of the subsurface reservoir over time. A post-Newton material balance corrector may be employed when all equation sets satisfy the convergence criterion and the stability criterion.

In another aspect, a computer program product is provided having computer executable logic recorded on a tangible, machine readable medium. Code is provided for determining a stability limit for each of a plurality of cells in a reservoir model that approximates a subsurface hydrocarbon reservoir. Each cell has associated therewith an equation set representing a reservoir property. Code is provided for assigning each cell to an explicit formulation or an implicit formulation. Code is provided for providing an initial guess to a solution for a system of equations formed using the equation set for each cell in the plurality of cells. Code is provided for using the initial guess to solve for a solution to the system of equations using an explicit formulation for cells assigned thereto and an implicit formulation for cells assigned thereto. Code is provided for establishing a list of unconverged cells. The unconverged cells have equation sets that have not satisfied a convergence criterion. Code is provided for calculating a stability limit for each of the converged cells. The converged cells have equation sets that have satisfied the convergence criterion. Code is provided for constructing a reduced nonlinear system with the list of unconverged cells when the number of unconverged cells is greater than a predetermined amount. The reduced nonlinear system is assigned to be solved with the implicit formulation, and other cells are assigned to be solved with the explicit formulation. Code is provided for repeating the using, establishing, calculating, and constructing parts of the code, substituting the solved solution for the initial guess or the most recent solved solution and substituting the equation sets corresponding to the cells in the list of unconverged cells for the system of equations or equation sets from the most recent iteration, until all equation sets satisfy the convergence criterion and a stability criterion. Code is provided for outputting the solved solution as a result for a timestep of a simulation of the subsurface reservoir when all equation sets satisfy the convergence criterion and the stability criterion.

According to disclosed methodologies and techniques, code may be provided for adding the following to the list of unconverged cells when the number of unconverged cells is greater than a predetermined amount: converged cells with one or more reservoir properties exhibiting changes greater than a preset amount; converged cells that do not satisfy the stability criterion; and any cell that is neighbor to a cell in the list of unconverged cells and that does not satisfy the stability criterion. Code may be provided for repeating some or all of the code at additional timesteps. The solved solutions for the first timestep and the additional timesteps may be outputted. The solved solutions may simulate the subsurface reservoir over time.

In still another aspect, a method is provided for managing hydrocarbon resources. A subsurface hydrocarbon reservoir is approximated with a reservoir model having a plurality of cells. Each cell has an associated equation set that represents a reservoir property. A stability limit is determined for each of the plurality of cells. Each cell is assigned to an explicit formulation or an implicit formulation. An initial guess is provided to a solution for a system of equations formed using the equation set for each cell in the plurality of cells. The initial guess is used to solve for a solution to the system of equations using an explicit formulation for cells assigned thereto and an implicit formulation for cells assigned thereto. A list of unconverged cells is established. The unconverged cells have equation sets that have not satisfied a convergence criterion. A stability limit is calculated for each of the converged cells. The converged cells have equation sets that have satisfied the convergence criterion. When the number of unconverged cells is greater than a predetermined amount, a reduced nonlinear system is constructed with the list of unconverged cells, the reduced nonlinear system being assigned to be solved with the implicit formulation and other cells being assigned to be solved with the explicit formulation. The using, establishing, calculating, and constructing steps are repeated, substituting the solved solution for the initial guess or the most recent solved solution and substituting the equation sets corresponding to the cells in the list of unconverged cells for the system of equations or equation sets from the most recent iteration, until all equation sets satisfy the convergence criterion and a stability criterion. When all equation sets satisfy the convergence criterion and the stability criterion, the solved solution is outputted as a result of a timestep of a simulation of the subsurface reservoir. Hydrocarbon resources are managed using the simulation of the subsurface reservoir.

According to disclosed methodologies and techniques, the simulated characteristic may be fluid flow in the subsurface reservoir. Managing hydrocarbons may include extracting hydrocarbons from the subsurface reservoir.

BRIEF DESCRIPTION OF THE DRAWINGS

The foregoing and other advantages of the present invention may become apparent upon reviewing the following detailed description and drawings of non-limiting examples of embodiments in which.

DETAILED DESCRIPTION

Figure 1:
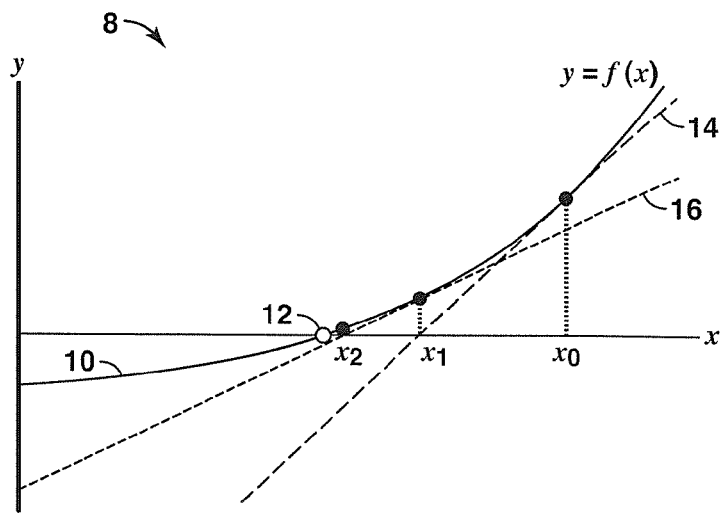
FIG. 1 is a graph demonstrating the known Newton's Method.

To the extent the following description is specific to a particular embodiment or a particular use, this is intended to be illustrative only and is not to be construed as limiting the scope of the invention. On the contrary, it is intended to cover all alternatives, modifications, and equivalents that may be included within the spirit and scope of the invention.

Some portions of the detailed description which follows are presented in terms of procedures, steps, logic blocks, processing and other symbolic representations of operations on data bits within a memory in a computing system or a computing device. These descriptions and representations are the means used by those skilled in the data processing arts to most effectively convey the substance of their work to others skilled in the art. In this detailed description, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

Unless specifically stated otherwise as apparent from the following discussions, terms such as "determining", "assigning", "providing", "using", "solving", "establishing", "calculating", "constructing", "substituting", "adding", "repeating", "outputting", "employing", "estimating", "identifying", "iterating", "running", "approximating", "simulating", "displaying", or the like, may refer to the action and processes of a computer system, or other electronic device, that transforms data represented as physical (electronic, magnetic, or optical) quantities within some electrical device's storage into other data similarly represented as physical quantities within the storage, or in transmission or display devices. These and similar terms are to be associated with the appropriate physical quantities and are merely convenient labels applied to these quantities.

Embodiments disclosed herein also relate to an apparatus for performing the operations herein. This apparatus may be specially constructed for the required purposes, or it may comprise a general-purpose computer selectively activated or reconfigured by a computer program or code stored in the computer. Such a computer program or code may be stored or encoded in a computer readable medium or implemented over some type of transmission medium. A computer-readable medium includes any medium or mechanism for storing or transmitting information in a form readable by a machine, such as a computer ('machine' and 'computer' are used synonymously herein). As a non-limiting example, a computer-readable medium may include a computer-readable storage medium (e.g., read only memory ("ROM"), random access memory ("RAM"), magnetic disk storage media, optical storage media, flash memory devices, etc.). A transmission medium may be twisted wire pairs, coaxial cable, optical fiber, or some other suitable transmission medium, for transmitting signals such as electrical, optical, acoustical or other form of propagated signals (e.g., carrier waves, infrared signals, digital signals, etc.)).

Furthermore, modules, features, attributes, methodologies, and other aspects can be implemented as software, hardware, firmware or any combination thereof. Wherever a component of the invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the invention is not limited to implementation in any specific operating system or environment.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional blocks not shown herein. While the figures illustrate various actions occurring serially, it is to be appreciated that various actions could occur in series, substantially in parallel, and/or at substantially different points in time.

Various terms as used herein are defined below. To the extent a term used in a claim is not defined below, it should be given the broadest possible definition persons in the pertinent art have given that term as reflected in at least one printed publication or issued patent.

As used herein, "and/or" placed between a first entity and a second entity means one of (1) the first entity, (2) the second entity, and (3) the first entity and the second entity. Multiple elements listed with "and/or" should be construed in the same fashion, i.e., "one or more" of the elements so conjoined.

As used herein, "cell" is a subdivision of a grid, for example, a reservoir simulation grid. Cells may be two-dimensional or three-dimensional. Cells may be any shape, according to how the grid is defined.

As used herein, "displaying" includes a direct act that causes displaying, as well as any indirect act that facilitates displaying. Indirect acts include providing software to an end user, maintaining a website through which a user is enabled to affect a display, hyperlinking to such a website, or cooperating or partnering with an entity who performs such direct or indirect acts. Thus, a first party may operate alone or in cooperation with a third party vendor to enable the reference signal to be generated on a display device. The display device may include any device suitable for displaying the reference image, such as without limitation a CRT monitor, a LCD monitor, a plasma device, a flat panel device, or printer. The display device may include a device which has been calibrated through the use of any conventional software intended to be used in evaluating, correcting, and/or improving display results (e.g., a color monitor that has been adjusted using monitor calibration software). Rather than (or in addition to) displaying the reference image on a display device, a method, consistent with the invention, may include providing a reference image to a subject. "Providing a reference image" may include creating or distributing the reference image to the subject by physical, telephonic, or electronic delivery, providing access over a network to the reference, or creating or distributing software to the subject configured to run on the subject's workstation or computer including the reference image. In one example, the providing of the reference image could involve enabling the subject to obtain the reference image in hard copy form via a printer. For example, information, software, and/or instructions could be transmitted (e.g., electronically or physically via a data storage device or hard copy) and/or otherwise made available (e.g., via a network) in order to facilitate the subject using a printer to print a hard copy form of reference image. In such an example, the printer may be a printer which has been calibrated through the use of any conventional software intended to be used in evaluating, correcting, and/or improving printing results (e.g., a color printer that has been adjusted using color correction software).

As used herein, "exemplary" is used exclusively herein to mean "serving as an example, instance, or illustration." Any aspect described herein as "exemplary" is not necessarily to be construed as preferred or advantageous over other aspects.

As used herein, "hydrocarbon reservoirs" include reservoirs containing any hydrocarbon substance, including for example one or more than one of any of the following: oil (often referred to as petroleum), natural gas, gas condensate, tar and bitumen.

As used herein, "hydrocarbon management" or "managing hydrocarbons" includes hydrocarbon extraction, hydrocarbon production, hydrocarbon exploration, identifying potential hydrocarbon resources, identifying well locations, determining well injection and/or extraction rates, identifying reservoir connectivity, acquiring, disposing of and/or abandoning hydrocarbon resources, reviewing prior hydrocarbon management decisions, and any other hydrocarbon-related acts or activities.

As used herein, "implicit function" is a mathematical rule or function which permits computation of one variable directly from another when an equation relating both variables is given. For example, y is an implicit function of x in the equation $x+3y+xy=0$.

As used herein, "machine-readable medium" refers to a medium that participates in directly or indirectly providing signals, instructions and/or data. A machine-readable medium may take forms, including, but not limited to, non-volatile media (e.g. ROM, disk) and volatile media (RAM). Common forms of a machine-readable medium include, but are not limited to, a floppy disk, a flexible disk, a hard disk, a magnetic tape, other magnetic medium, a CD-ROM, other optical medium, a RAM, a ROM, an EPROM, a FLASH-EPROM, EEPROM, or other memory chip or card, a memory stick, and other media from which a computer, a processor or other electronic device can read.

In the context of cell location, "neighbor" means adjacent or nearby.

As used herein, "subsurface" means beneath the top surface of any mass of land at any elevation or over a range of elevations, whether above, below or at sea level, and/or beneath the floor surface of any mass of water, whether above, below or at sea level.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional blocks not shown herein. While the figures illustrate various actions occurring serially, it is to be appreciated that various actions could occur in series, substantially in parallel, and/or at substantially different points in time.

Adaptive Newton's Method

Another method for solving systems of equations is described in U.S. Patent Application No. 61/265,103 entitled "Adaptive Newton's Method For Reservoir Simulation" filed Nov. 30, 2009 and having common inventors herewith, said application being incorporated by reference herein in its entirety for all purposes. Portions of the disclosure of Application No. 61/265,103 are provided herein.

An iterative root-finding method such as Newton's Method characterizes the system of simulation equations into a form that makes the solution an exercise in finding the zeros of a function, i.e. finding x such that $f(x)=0$. It is observed that in reservoir simulators the convergence behavior of Newton's Method is non-uniform through the reservoir grid. Some parts of the reservoir grid converge (i.e., the term $(\vec{x}_i - \vec{x}_{i-1})$ is below $\epsilon$) in a single iteration while other parts of the reservoir grid require many iterative steps to converge. The standard Newton's Method requires that equations for the entire reservoir grid system are solved at each iteration, regardless whether parts of the reservoir have already converged. A method may be provided to adaptively target an iterative method like Newton's Method to only a portion of the reservoir cells while not losing the effectiveness of the convergence method.

More specifically, it is noted that portions of a reservoir simulation domain are relatively easy to solve while other areas are relatively hard to solve. Typical reservoir simulation models involve the injection or production of fluid at specific locations. It is the areas around these injection/production locations that the hard solutions typically appear. This leads to the variability in the solution characteristics in a reservoir simulator. Applying standard methods that apply the same technique to all areas of the reservoirs will suffer from a "weakest link" phenomenon, i.e. the solution method will apply the same amount of effort in solving in the problem in the easy and hard areas, thereby leading to overwork on the total solution.

Figure 6:
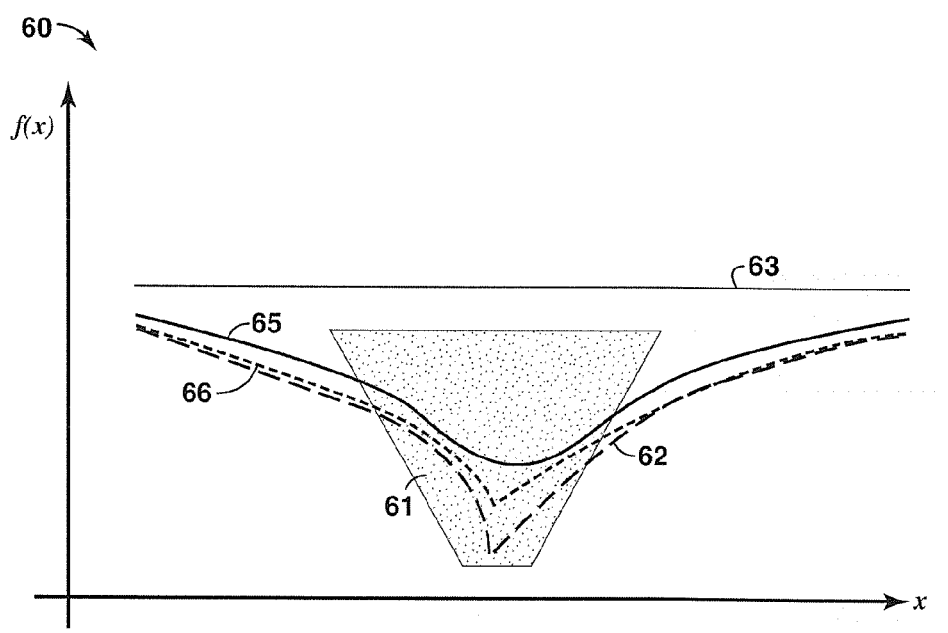
FIG. 6 is a graph demonstrating a strategy for performing an adaptive iterative equation solving method.

The adaptive Newton's method takes advantage of the extremely non-uniform convergence behavior found in reservoir simulation datasets. FIG. 6 is a graph 60 showing a graphic representation of the Adaptive Newton Method. The true solution that the reservoir simulator seeks to find at a particular time is given by the solid line 62. The initial guess 63 is relatively far from the true solution everywhere. Two iterations of an iterative solution method, such as Newton's Method, are shown by dashed lines 65, 66. Conventional application of an iterative solution method to reservoir simulators seeks to find the solution along the entire x-axis. The Adaptive Newton's Method uses knowledge of the previous iterative method only to continue to work in a subset of the modeled domain (the x-axis). This subset is the part of the solution space furthest from the true solution and is shown by the area 61. The Adaptive Newton's Method attempts no solutions in areas outside of area 61 as those areas have already converged.

Figure 7:
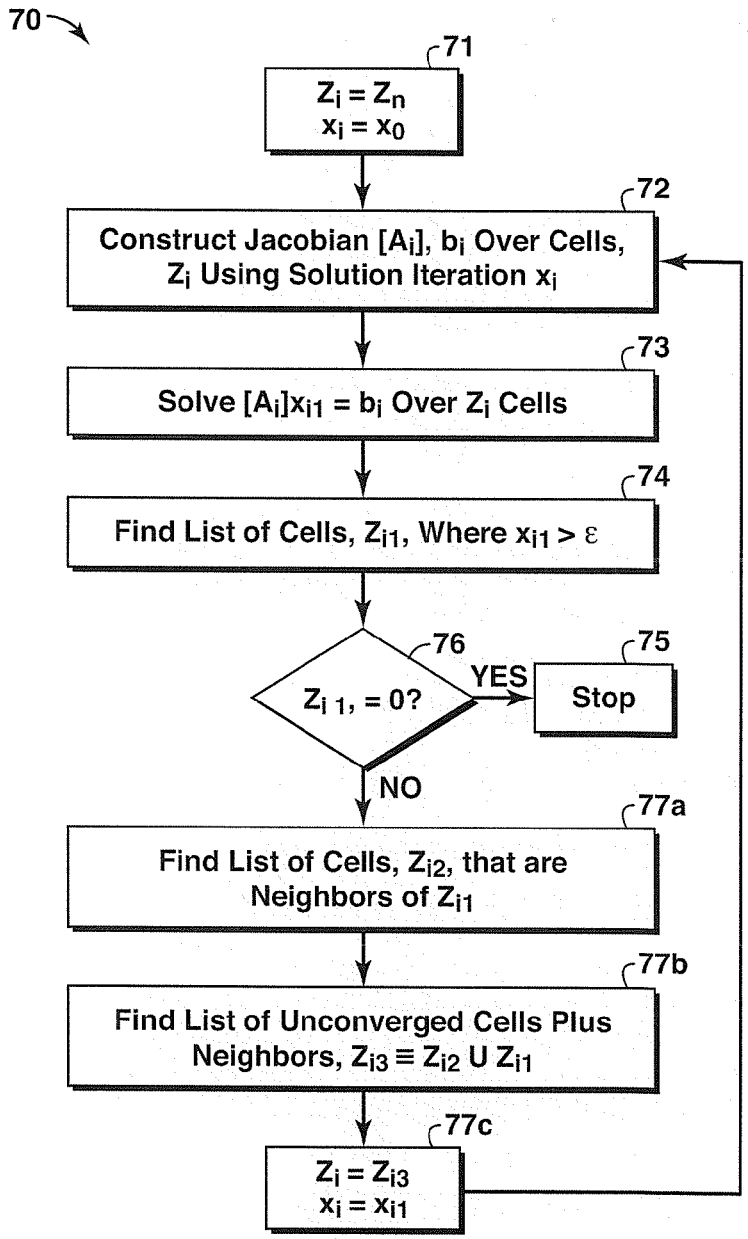
FIG. 7 is a flowchart of an Adaptive Newton's Method.

FIG. 7 is a flowchart of the Adaptive Newton's Method 70 that may be used to perform a simulation of a subsurface hydrocarbon reservoir. The reservoir may be approximated by a reservoir model, which has a plurality of cells. Each cell has one or more equations (an equation set) characterizing one or more reservoir properties, such as fluid flow, in the cell. In this discussion the term "cell" may be used interchangeably with its associated equation set. At block 71a solution vector $\vec{x}_i$, representing the solutions for the system of equations, is set to an initial guess $\vec{x}_0$. The number of cells to solve, is set to the total number of cells $Z_n$. At block 72 a Jacobian Matrix $J_i$ and a vector $\vec{b}_i$ are constructed for all cells $Z_i$ using the solution vector $\vec{x}_i$. At block 73 a new solution estimate is obtained for cells $Z_i$. At block 74 it is determined which cells $Z_{i1}$ are unconverging, which may be defined as having associated equation sets that have not satisfied a convergence criterion ε. If the number of unconverging cells is zero, then at block 75 the method stops. However, if at block 76 it is determined that the number of unconverging cells is not zero, then at block 77a the neighbors $Z_{i2}$ of the unconverged cells $Z_{i1}$ are found. At block 77b a new list $Z_{i3}$ is created comprising the unconverged cells $Z_{i1}$ and the neighbors $Z_{i2}$. At block 77c the new list $Z_{i3}$ becomes the list of cells to proceed in the next iteration. The solution guess vector $\vec{x}_i$ is set to the new solution estimate $\vec{x}_{i1}$, and the process returns to block 72. The method repeats until no cells are unconverging. At that point the system of equations may be considered solved.

Figure 2:
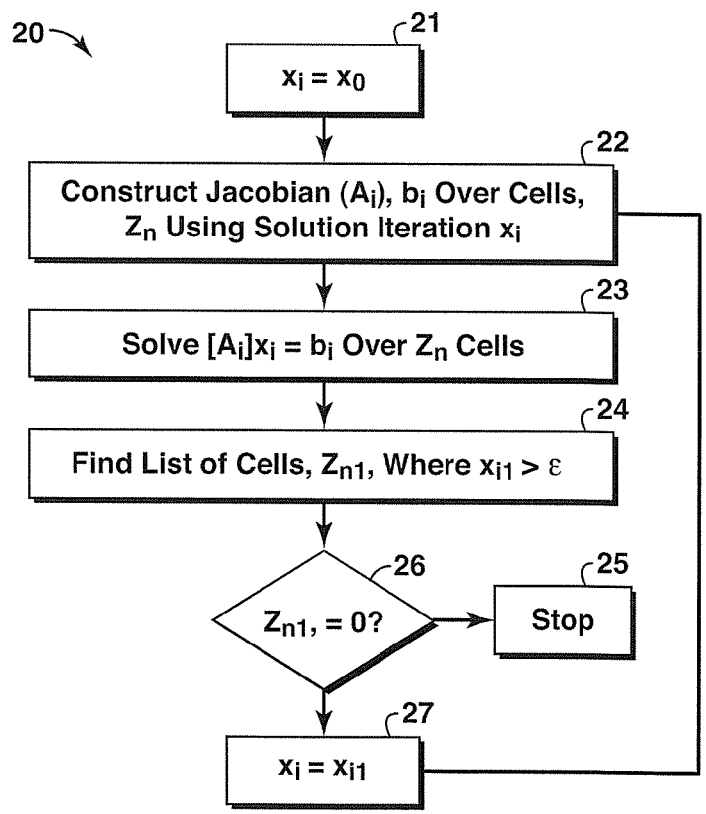
FIG. 2 is a flowchart showing steps used in executing the known Newton's Method.
Figure 3A:
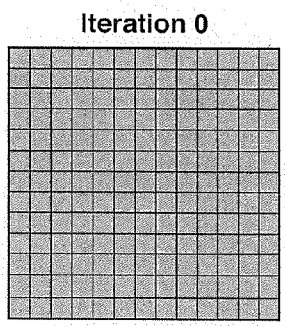
FIGS. 3A, 3B, 3C and 3D are schematic diagrams showing convergence of a system of equations using the known Newton's Method.
Figure 3B:
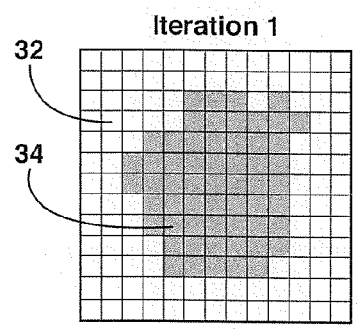
Figure 3C:
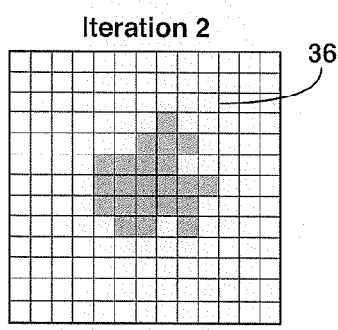
Figure 3D:
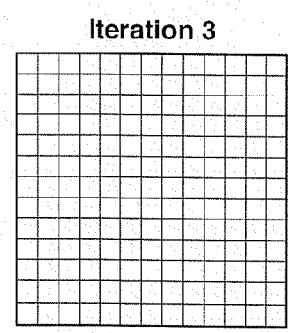
Figure 4A:
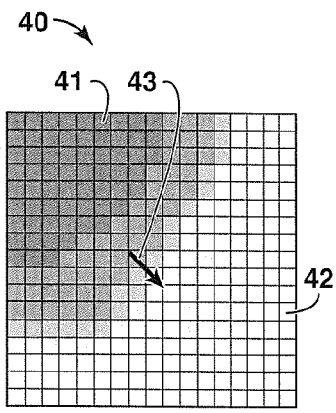
FIGS. 4A, 4B and 4C are schematic diagrams showing how the Adaptive Implicit Method may be used in solving a fluid flow simulation.
Figure 4B:
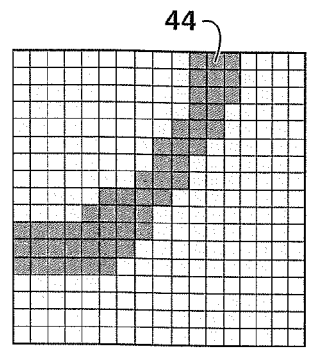
Figure 4C:
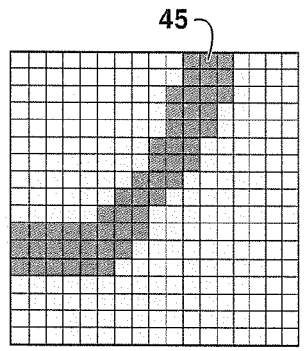
Figure 5:
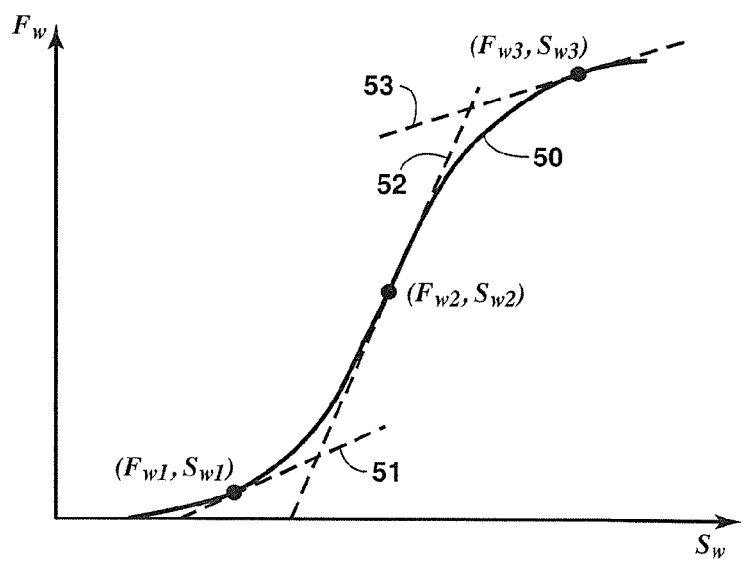
FIG. 5 is a graph demonstrating changes in stability calculations at different times in a timestep.

In the iterative loop of the known Newton's Method (FIG. 2) the number of grid cells used to construct the Jacobian matrix J and the residual vector $\vec{b}_i$ is constant for every iteration. In the Adaptive Newton's Method (FIG. 7), only those cells where the solution has yet to be found, and their converged neighbor cells, are used in subsequent updates of the Jacobian matrix J and the residual vector $\vec{b}_i$. As a result, the size of the Jacobian matrix J and the vector $\vec{b}_i$ may vary with each iteration, and ideally will be much smaller than the fixed-sized Jacobian matrix J and $\vec{b}_i$ used with known methods. The successively smaller size of the systems of equations used by the adaptive approach means less computational resources and time are required to run a reservoir simulation when compared with known methods.

Figure 8A:
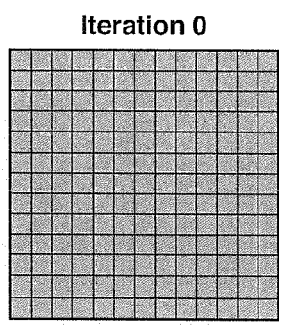
FIGS. 8A, 8B, 8C, and 8D are schematic diagrams showing convergence of a system of equations using the Adaptive Newton's Method.
Figure 8B:
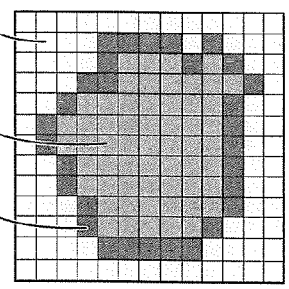
Figure 8C:
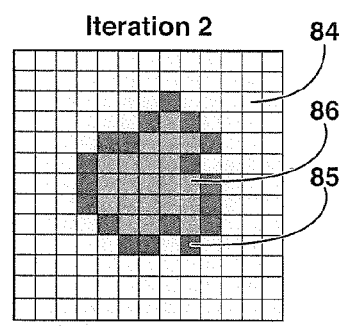
Figure 8D:
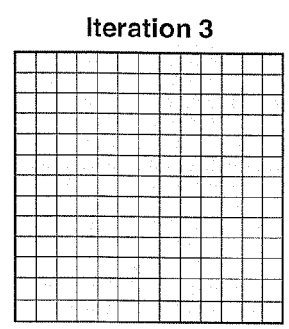

FIGS. 8A, 8B, 8C and 8D depict a two-dimensional 13-by-13 rectangular grid 80 similar to the grid 30 shown in FIGS. 3A-3D. Each cell in grid 80 has an equation set associated therewith. Prior to any iteration (FIG. 8A) the 169 equation sets are used as inputs to the Adaptive Newton's Method. After one iteration of the Adaptive Newton's Method (FIG. 8B) the equation sets associated with 111 cells have converged (shown by the lighter-colored cells 82 and 83). In other words, some areas of the reservoir have found solutions such that the term $(\vec{x}_i - \vec{x}_{i-1})$ is below ε for those areas. The unconverged cells are shown as darker colored cells 84. Instead of using all 169 equations sets in the second iteration (FIG. 8C), the Adaptive Newton's Method solves only for the unconverged equation sets (represented by cells 84) and the converged equation sets associated with the cells that neighbor cells 84 (in FIG. 8B, cells 83), which together number 88. After the second iteration (FIG. 8C) the equation sets associated with 147 cells have converged (cells 84 and 85) and the equation sets associated with 22 cells have not converged (cells 86). 39 equation sets (representing the number of unconverged cells 86 and their converged neighbor cells 85) are returned for a third iteration (FIG. 8D). After the third iteration is completed all equation sets have converged. The decreasing number of equation sets to be solved at each iteration of the Adaptive Newton's Method results in a significant time and computational savings over known methods.

Flexible and Adaptive Formulations

Figure 9:
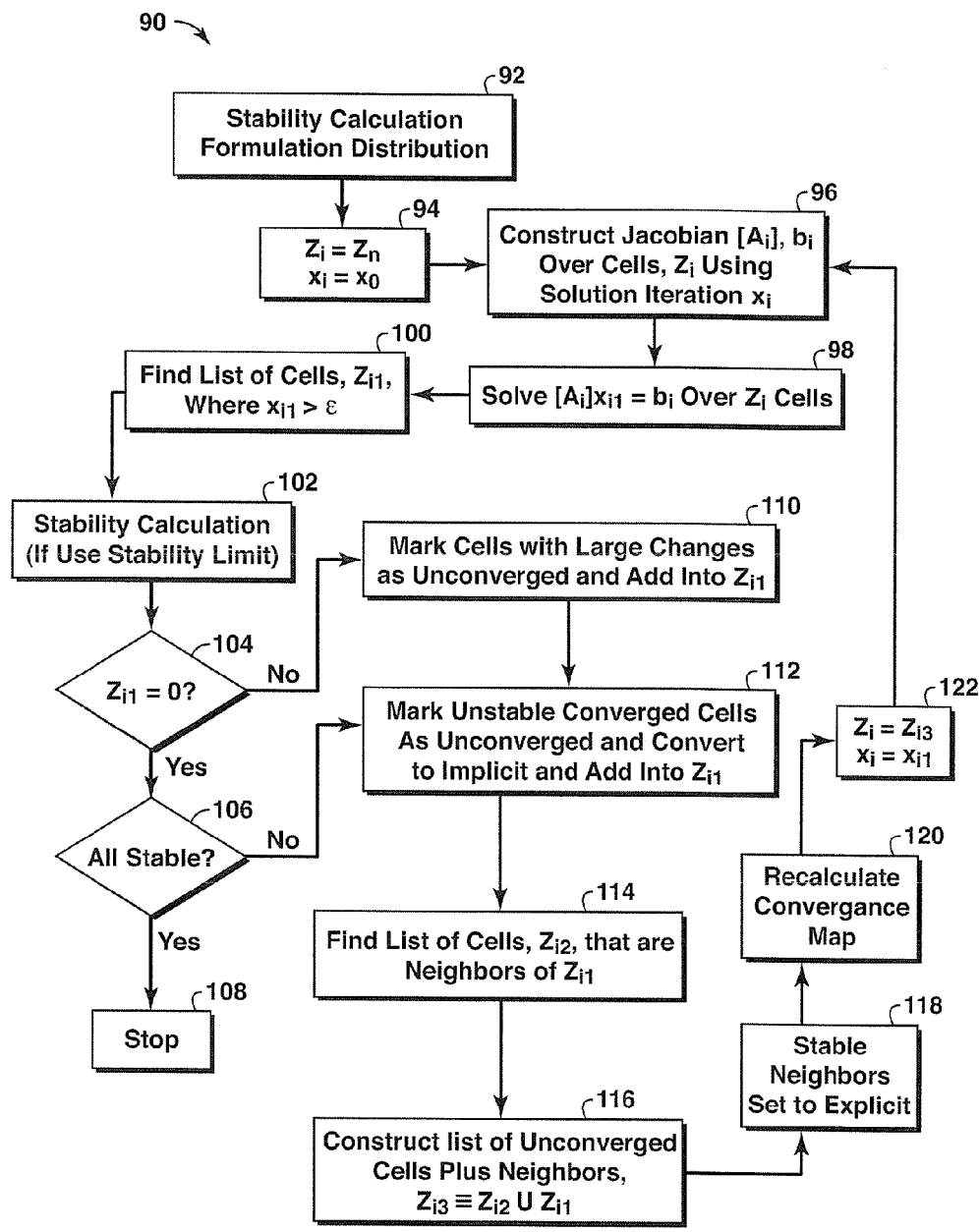
FIG. 9 is a flowchart of a flexible and adaptive method according to disclosed methodologies and techniques.

The limitations of fully implicit equation solving strategies such as the Newton's Method and the Adaptive Newton's Method have been discussed herein. It is observed that the degree of nonlinearity in the system and degree of implicitness required in reservoir simulators are nonuniform through the grid. Furthermore, the highly nonlinear region does not necessarily always require a high degree of implicitness. The disclosed aspects provide a method to integrate the described methods within a flexible and adaptive nonlinear formulation framework, in which the balance between stability and speed can be optimized such that simulation run time performance will be significantly improved. FIG. 9 is a flowchart showing a method 90 according to disclosed aspects. At block 92 stability limits for each cell in a simulation model are calculated using, for example, the CFL number as previously discussed. Based on the calculated or predicted stability or on some predefined characteristic by a user, each cell is assigned or distributed to an implicit formulation or an explicit formulation. Specifically, relatively stable cells normally will be assigned to an explicit formulation, while relatively unstable cells normally will be assigned to an implicit formulation. When the cells have been assigned, at block 94 a solution vector, representing the solutions for the system of equations, is set to an initial guess $\vec{x}_i$. The number of cells to solve, is set to the total number of cells $Z_n$. At block 96 a Jacobian Matrix $J_i$ and a vector $\vec{b}_i$ are constructed for all cells $Z_i$ using the solution vector $\vec{x}_i$. At block 98 a new solution estimate $\vec{x}_{i1}$ is obtained for cells $Z_i$. At block 100 it is determined which cells $Z_{i1}$ are not converged, which may be defined as having associated equation sets that have not satisfied a convergence criterion $\epsilon$. A convergence map may be created that indicates the convergence status of each cell. At block 102 stability limits are calculated on converged cells and the neighbors, or boundary cells, of the converged cells. At block 104 it is determined if all cells have converged, which is true when $Z_{i1}=0$. At block 104 it is determined if all converged cells are stable. If so, the method stops at block 108.

If at block 104 it is determined some cells have not converged (i.e., when $Z_{i1}>0$), a reduced nonlinear system is constructed, which will be solved by an implicit formulation. The reduced system includes the non-converged cells discovered at block 100. In addition, at block 110 cells with large changes in pressure and saturation (beyond pre-set limits) are marked as non-converged and added to the reduced system. By marking these cells as non-converged, the method instructs these cells to be solved using an implicit formulation. At block 112 unstable converged cells are added to the reduced system. By being added to the non-converged cells the method instructs these cells to be solved using the implicit formulation. At block 114 the unstable neighbors $Z_{i2}$ of the unconverged cells $Z_{i1}$ are found. At block 116 a new list $Z_{i3}$ is created comprising the unconverged cells $Z_{i1}$ and the neighbors $Z_{i2}$. At block 118 stable neighbors are set to be solved using explicit formulation. At block 120 the convergence map is recalculated because at block 122 the new list $Z_{i3}$ becomes the list of cells to proceed in the next iteration. The solution guess vector $\vec{x}_i$ is set to the new solution estimate $\vec{x}_{i1}$, and the process returns to block 96. The method repeats until no cells are non-converged and unstable. At that point the system of equations may be considered solved. Even if all cells have converged (block 104), if not all cells are stable (block 106) the method goes to block 112, where unstable converged cells are marked as unconverged and become the reduced nonlinear system. The method repeats with this reduced system until all cells are solved and stable.

Figure 10A:
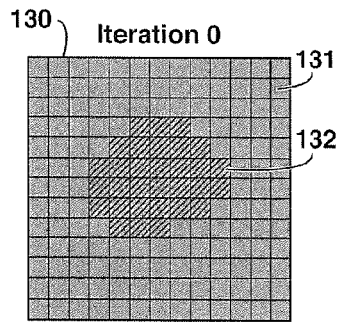
FIGS. 10A, 10B, 10C, 10D, and 10E are schematic diagrams showing convergence of a system of equations using the flexible and adaptive method according to disclosed methodologies and techniques.
Figure 10B:
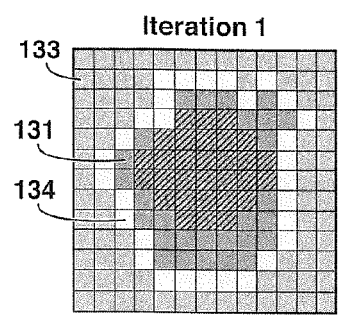
Figure 10C:
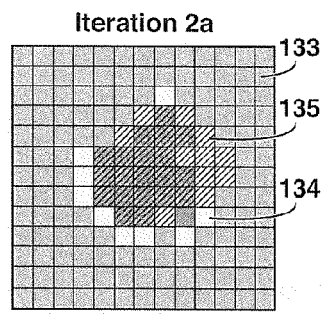
Figure 10D:
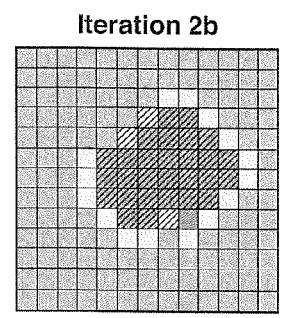
Figure 10E:
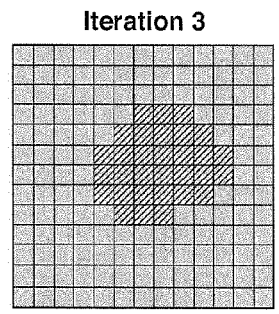

FIGS. 10A, 10B, 10C, 10D and 10E show an example of the flexible and adaptive formulation as applied in a reservoir simulator according to disclosed methodologies and techniques. As with the Adaptive Newton's method, a rectangular grid 130 is presented here but the method is applicable to any type of grid. FIGS. 10A-10E depicts a 13×13 reservoir simulation grid at a particular timestep. At the beginning of the iterative cycle, as shown in FIG. 10A, all grid cells are unconverged, denoted by a first level of shading 131. The thirty cells to be solved using an implicit formulation, termed the implicit cells, are indicated by cross-hatching 132. As previously discussed the implicit cells are determined by stability criteria such as the CFL number. In the first iteration Newton's method is applied and the solution is updated. FIG. 10B represents possible results where after the first iteration 111 cells have converged. The converged cells are shown as unshaded cells 133 and cells having a second level of shading 134. The cells having the second level of shading 134 are neighbors of unconverged cells 131. In this particular example, no formulation change is necessary after the first iteration because there are no converged unstable nodes at this point. In the second iteration only the unconverged cells 131 and the neighbor cells 134 are used to calculate the next iterative results. A reduced system is solved on this second iteration with 88 active cells. FIG. 10C represents possible results after the second iteration, where 147 cells have converged (unshaded cells 133 and cells with second level of shading 134). However, the stability calculation dictates that certain cells become unstable at this iteration. Instead of being solved by the explicit formulation, the converged unstable cells are marked as unconverged and switched to be solved using the implicit formulation. Correspondingly, the boundary cells are updated, as shown in FIG. 10D. The change in unstable cells is also shown by the cross-hatching of cells at 135 in FIG. 10D. This change also represents which cells are to be solved using an implicit formulation in the next iteration. At the beginning of the third iteration only 57 cells are used (unconverged cells 131 plus boundary cells 134) instead of 169 cells. In this hypothetical example all cells have converged after three iterations (FIG. 10E) and the solution for that timestep has been found. The change in number and distribution of cross-hatched cells from FIG. 10A to FIG. 10E shows that the formulation distribution has changed from the beginning of the timestep to the end of the timestep.

Figures 11, 12:
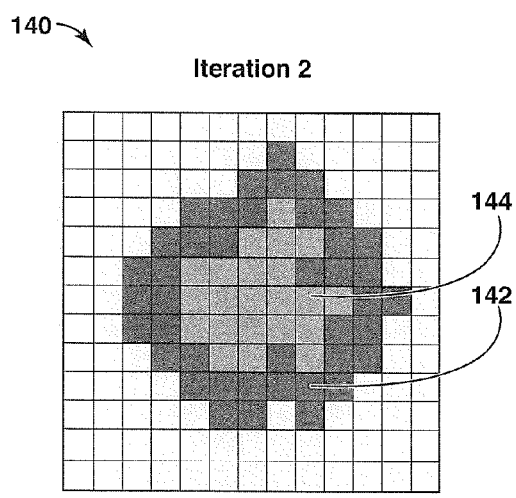
FIG. 11 is a graph comparing performance of various implicit formulations.
FIG. 12 is a schematic diagram showing a cell selection strategy according to disclosed methodologies and techniques.

FIG. 11 shows the performance comparison between four different implicit formulation methods: the conventional Newton's method, the conventional AIM method, the Adaptive Newton's method, and the flexible and adaptive method disclosed herein. The methods are compared using the same hypothetical example as shown in FIG. 10. In this example, it is assumed there are three unknowns per implicit cell and one unknown per explicit cell. All four methods take three Newton iterations to converge, though with different computational cost per iteration. In addition, the conventional AIM encounters some numerical stability issues at the end of the timestep and would need to take a timestep cut. By comparing the total number of equations solved by each method, it can be seen that the flexible and adaptive method disclosed herein can provide significant runtime savings over the other three methods.

The flexible and adaptive method disclosed herein is described as being used at each iteration. However, the smaller solution sets formed at later iterations could be solved by root-finding methods that are more efficient and more robust for the smaller sizes of equation sets, such as a combination of direct linear solver and robust (maybe more expensivie) nonlinear solver). Changing the size of the matrix as well as the type of method for each iteration is an additional variation.

As discussed previously, including cells bordering or neighboring converged cells helps the disclosed flexible and adaptive method work successfully. It is believed this is so because the border cells provide accurate boundary conditions to the unconverged cells. Previously disclosed aspects have used only one layer of neighbor cells, but in another aspect more than one layer of neighbors may be used. The number of layers are correlated with how the pressure wave propagates within the reservoir, which could be a function of reservoir properties and timestep sizes. The concept of "radius of investigation" can be employed within this context. As this would increase the number of equation sets to be solved at each iteration, some of the solving time otherwise saved would be lost. However, having two or more layers of neighbor cells might be useful in making the method more robust for very difficult problems. FIG. 12 illustrates this idea with a 13-by-13 rectangular grid 140 similar to rectangular grid 130. On the second iteration of an iterative root solver such as the disclosed flexible and adaptive method, the nearest two neighbors 142 to each unconverged cell 144 are included in a subsequent iteration of the disclosed flexible and adaptive method. While this increases the number of equation sets to solve from 39 to 63, it still is significantly less than the known Newton's Method, which as demonstrated would use 169 equation sets in each iteration. In unusual cases the number of selected neighboring converged cells may be all of the converged cells, or alternatively may comprise a single converged cell. In other words the number of selected neighbor cells may be between 1 and N−W, where N is the total number of cells in the reservoir model and W is the number of cells having equation sets that satisfy the convergence criterion at the relevant iteration. Other strategies or methods to select the number and location of converged cells to be combined with unconverged cells are contemplated.

In another aspect, a post-Newton material balance correction/smoothing mechanism is disclosed. Because the global system is not solved at every iteration, some material balance errors or non-smoothness in the solution might be introduced. Among the possible approaches that can be used as a post-Newton smoother is known as an explicit molar update. Using the converged solution and updated reservoir properties on each cell, the molar fluxes on connections between cells can be calculated. The molar fluxes at each cell can be updated with $$N_{m,i}^{n+1} = N_{m,i}^{i} - \Delta t \sum_{j}^{conn} U_{m,i \to j}^{n+1} \qquad \text{[Equation 7]}$$

where $N_m^n$ is the moles for component m in cell i, $\Delta t$ is a timestep size, and $U_{m,i \to j}^{n+1}$ is the molar flux for component m between cell i and cell j with updated reservoir properties.

Another more sophisticated smoother is to use the idea of total volumetric flux conservation. With this scheme, the saturation correction can be computed while accounting for any material balance errors or volume discrepancies in the system. One specific form with the volume balance formulation is shown here:

$$V_{P,i}^{n+1} \delta S_{v,i} + \qquad \text{[Equation 8]}$$
$$\Delta t \sum_{m}^{comp} \left( \frac{\partial V_v}{\partial N_m} \right)_i^{n+1} \sum_{j}^{conn} \sum_{k=i,j} \sum_{v'}^{phase-1} \left( \frac{\partial U_{m,i \to j}}{\partial S_{v',k}} \right)^{n+1} \delta S_{v',k} =$$
$$\sum_{m}^{comp} \left( \frac{\partial V_v}{\partial N_m} \right)_i^{n+1} \varepsilon_{m,i}^{n+1} + \varepsilon_{v,i}^{n+1}$$

In this equation, $V_{Pj}^{n+1}$ is pore volume, $V_{v,i}^{n+1}$ phase volume, $S_{v,i}^{n+1}$ is phase saturation, $\delta S_{v,i}$ is saturation correction, and the material balance errors and phase volume discrepancies are $$\varepsilon_{m,i}^{n+1} = N_{m,i}^{n+1} - N_{m,i}^{n} - \Delta t \sum_{j}^{conn} U_{m,i \to j}^{n+1} \qquad \text{[Equations 9 and 10]}$$
$$\varepsilon_{v,i}^{n+1} = V_{v,i}^{n+1} - (S_v V_P)_i^{n+1}$$

The molar flux can be updated with the saturation correction term as $$U_{m,i \to j}^{n+\gamma} = U_{m,i \to j}^{n+1} + \sum_{k=i,j} \sum_{v}^{phase-1} \left( \frac{\partial U_{m,i \to j}}{\partial S_{v,k}} \right)^{n+1} \delta S_{v,k} \qquad \text{[Equation 11]}$$

Figure 13:
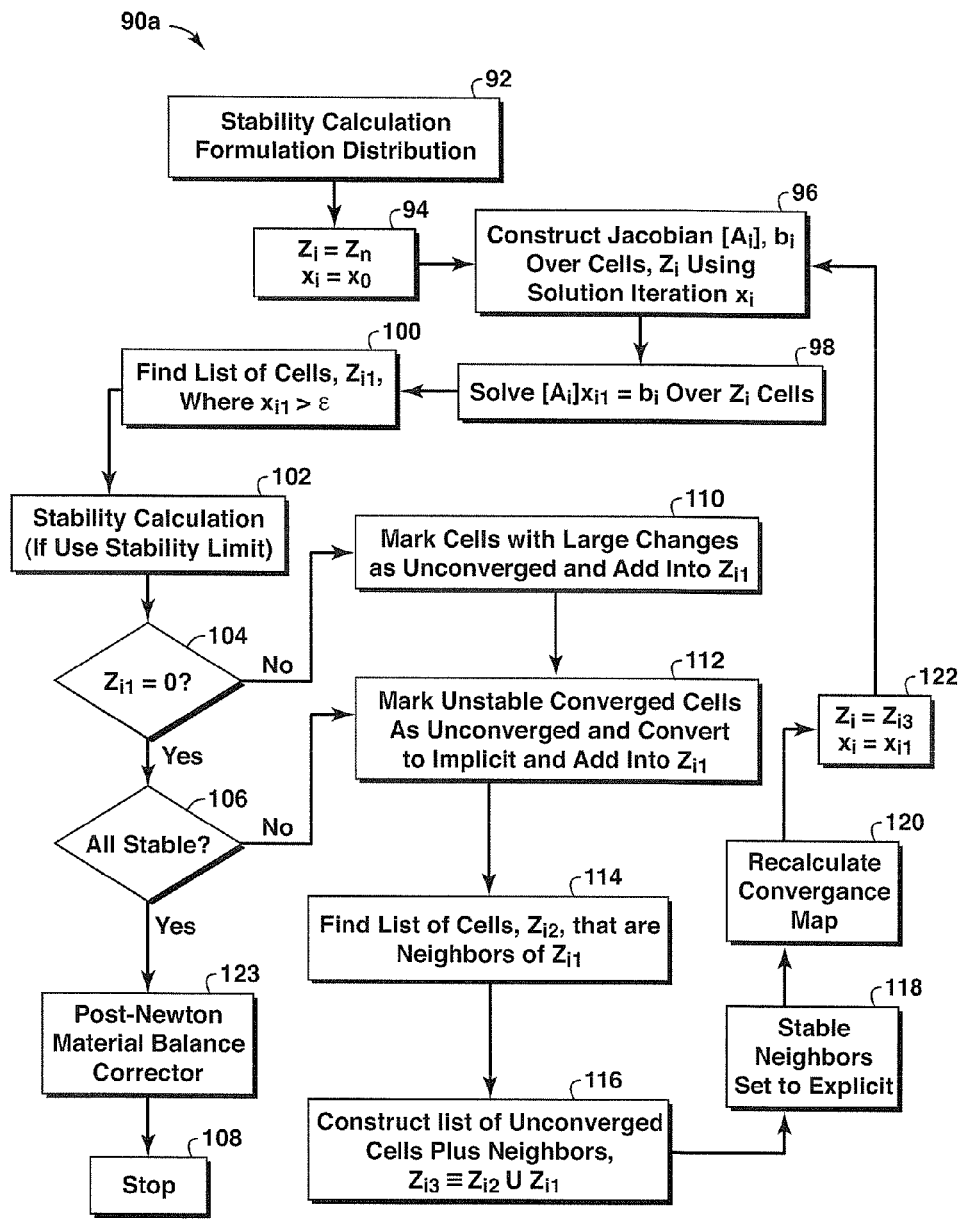
FIG. 13 is a flowchart of a method according to disclosed methodologies and techniques.

FIG. 13 is a flowchart showing a method 90a similar to the method shown in FIG. 9. Method 90a additionally employs a post-Newton material balance corrector. If at blocks 104 and 106 it is determined that the number of unconverging cells is zero or substantially zero and that all cells are stable, then at block 123 a post-Newton material balance corrector is employed as previously discussed. Once the material balance is corrected, at block 108 the method stops or ends.

Although methodologies and techniques described herein have used rectangular grids for demonstration purposes, grids of any size, type, or shape may be used with the disclosed aspects.

Figure 14:
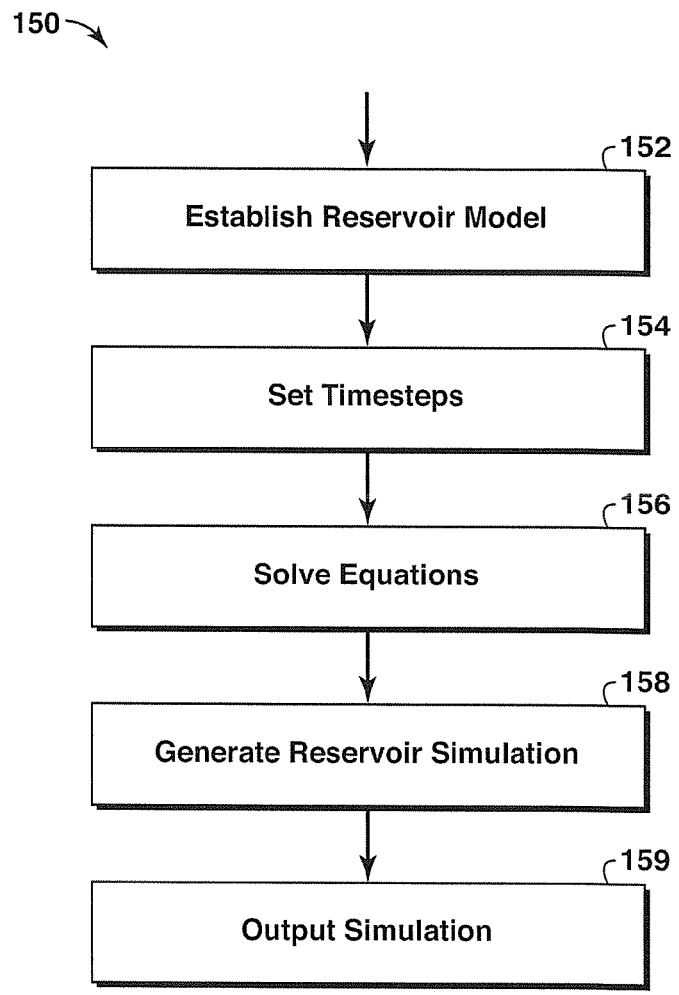
FIG. 14 is another flowchart of a method according to disclosed methodologies and techniques.

FIG. 14 is a flowchart showing a method 150 of performing a simulation of a subsurface hydrocarbon reservoir according to aspects described herein. At block 152 a model of the subsurface hydrocarbon reservoir is established. The model is formed of a plurality of cells. Each of the cells has an equation set associated therewith. The equation set includes one or more equations that represent a reservoir property in the respective cell. At block 154 the number and frequency of timesteps is set. The timesteps may be measured by any unit of time, such as seconds, months, years, centuries, and so forth. At block 156 solutions to the equation sets are discovered according to according to aspects and methodologies disclosed herein. For example the disclosed flexible and adaptive method may be performed iteratively at each timestep as described herein. Based on the output of block 156, at block 158 a reservoir simulation is generated, and at block 159 the simulation results are outputted, such as by displaying the simulation results.

Figure 15:
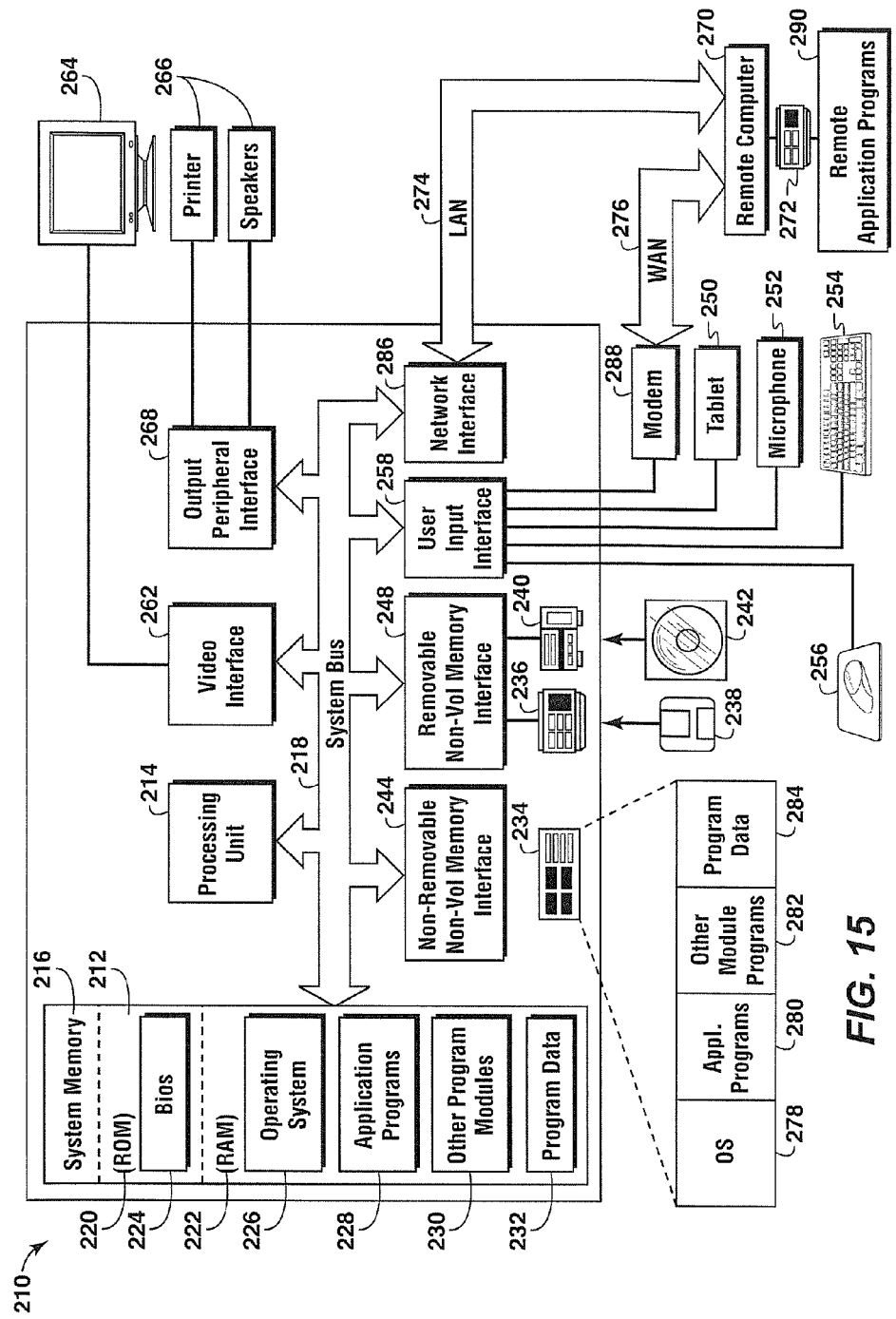
FIG. 15 is a block diagram illustrating a computer environment.

FIG. 15 illustrates an exemplary system within a computing environment for implementing the system of the present disclosure and which includes a computing device in the form of a computing system 210, which may be a UNIX-based workstation or commercially available from Intel, IBM, AMD, Motorola, Cyrix and others. Components of the computing system 210 may include, but are not limited to, a processing unit 214, a system memory 216, and a system bus 246 that couples various system components including the system memory to the processing unit 214. The system bus 246 may be any of several types of bus structures including a memory bus or memory controller, a peripheral bus, and a local bus using any of a variety of bus architectures.

Computing system 210 typically includes a variety of computer readable media. Computer readable media may be any available media that may be accessed by the computing system 210 and includes both volatile and nonvolatile media, and removable and non-removable media. By way of example, and not limitation, computer readable media may comprise computer storage media and communication media. Computer storage media includes volatile and nonvolatile, removable and non removable media implemented in any method or technology for storage of information such as computer readable instructions, data structures, program modules or other data.

Computer memory includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the computing system 210.

The system memory 216 includes computer storage media in the form of volatile and/or nonvolatile memory such as read only memory (ROM) 220 and random access memory (RAM) 222. A basic input/output system 224 (BIOS), containing the basic routines that help to transfer information between elements within computing system 210, such as during start-up, is typically stored in ROM 220. RAM 222 typically contains data and/or program modules that are immediately accessible to and/or presently being operated on by processing unit 214. By way of example, and not limitation, FIG. 15 illustrates operating system 226, application programs 228, other program modules 230 and program data 232.

Computing system 210 may also include other removable/non-removable, volatile/nonvolatile computer storage media. By way of example only, FIG. 15 illustrates a hard disk drive 234 that reads from or writes to non-removable, nonvolatile magnetic media, a magnetic disk drive 236 that reads from or writes to a removable, nonvolatile magnetic disk 238, and an optical disk drive 240 that reads from or writes to a removable, nonvolatile optical disk 242 such as a CD ROM or other optical media. Other removable/non-removable, volatile/nonvolatile computer storage media that may be used in the exemplary operating environment include, but are not limited to, magnetic tape cassettes, flash memory cards, digital versatile disks, digital video tape, solid state RAM, solid state ROM, and the like. The hard disk drive 234 is typically connected to the system bus 246 through a non-removable memory interface such as interface 244, and magnetic disk drive 236 and optical disk drive 240 are typically connected to the system bus 246 by a removable memory interface, such as interface 248.

The drives and their associated computer storage media, discussed above and illustrated in FIG. 15, provide storage of computer readable instructions, data structures, program modules and other data for the computing system 210. In FIG. 15, for example, hard disk drive 234 is illustrated as storing operating system 278, application programs 280, other program modules 282 and program data 284. These components may either be the same as or different from operating system 226, application programs 230, other program modules 230, and program data 232. Operating system 278, application programs 280, other program modules 282, and program data 284 are given different numbers hereto illustrates that, at a minimum, they are different copies.

A user may enter commands and information into the computing system 210 through input devices such as a tablet, or electronic digitizer, 250, a microphone 252, a keyboard 254, and pointing device 256, commonly referred to as a mouse, trackball, or touch pad. These and other input devices often may be connected to the processing unit 214 through a user input interface 258 that is coupled to the system bus 218, but may be connected by other interface and bus structures, such as a parallel port, game port or a universal serial bus (USB).

A monitor 260 or other type of display device may be also connected to the system bus 218 via an interface, such as a video interface 262. The monitor 260 may be integrated with a touch-screen panel or the like. The monitor and/or touch screen panel may be physically coupled to a housing in which the computing system 210 is incorporated, such as in a tablet-type personal computer. In addition, computers such as the computing system 210 may also include other peripheral output devices such as speakers 264 and printer 266, which may be connected through an output peripheral interface 268 or the like.

Computing system 210 may operate in a networked environment using logical connections to one or more remote computers, such as a remote computing system 270. The remote computing system 270 may be a personal computer, a server, a router, a network PC, a peer device or other common network node, and typically includes many or all of the elements described above relative to the computing system 210, although only a memory storage device 272 has been illustrated in FIG. 15. The logical connections depicted in FIG. 15 include a local area network (LAN) 274 connecting through network interface 286 and a wide area network (WAN) 276 connecting via modem 288, but may also include other networks. Such networking environments are commonplace in offices, enterprise-wide computer networks, intranets and the Internet. For example, computer system 210 may comprise the source machine from which data is being migrated, and the remote computing system 270 may comprise the destination machine. Note however that source and destination machines need not be connected by a network or any other means, but instead, data may be migrated via any machine-readable media capable of being written by the source platform and read by the destination platform or platforms.

The central processor operating system or systems may reside at a central location or distributed locations (i.e., mirrored or stand-alone). Software programs or modules instruct the operating systems to perform tasks such as, but not limited to, facilitating client requests, system maintenance, security, data storage, data backup, data mining, document/report generation and algorithms. The provided functionality may be embodied directly in hardware, in a software module executed by a processor or in any combination of the two.

Furthermore, software operations may be executed, in part or wholly, by one or more servers or a client's system, via hardware, software module or any combination of the two. A software module (program or executable) may reside in RAM memory, flash memory, ROM memory, EPROM memory, EEPROM memory, registers, hard disk, a removable disk, a CD-ROM, DVD, optical disk or any other form of storage medium known in the art. For example, a storage medium may be coupled to the processor such that the processor may read information from, and write information to, the storage medium. In the alternative, the storage medium may be integral to the processor. The processor and the storage medium may also reside in an application-specific integrated circuit (ASIC). The bus may be an optical or conventional bus operating pursuant to various protocols that are well known in the art. One system that may be used is a Linux workstation configuration with a Linux 64-bit or 32-bit Red Hat Linux WS3 operating system, and an NVIDIA Quadro graphics card. However, the system may operate on a wide variety of hardware.

Figure 16:
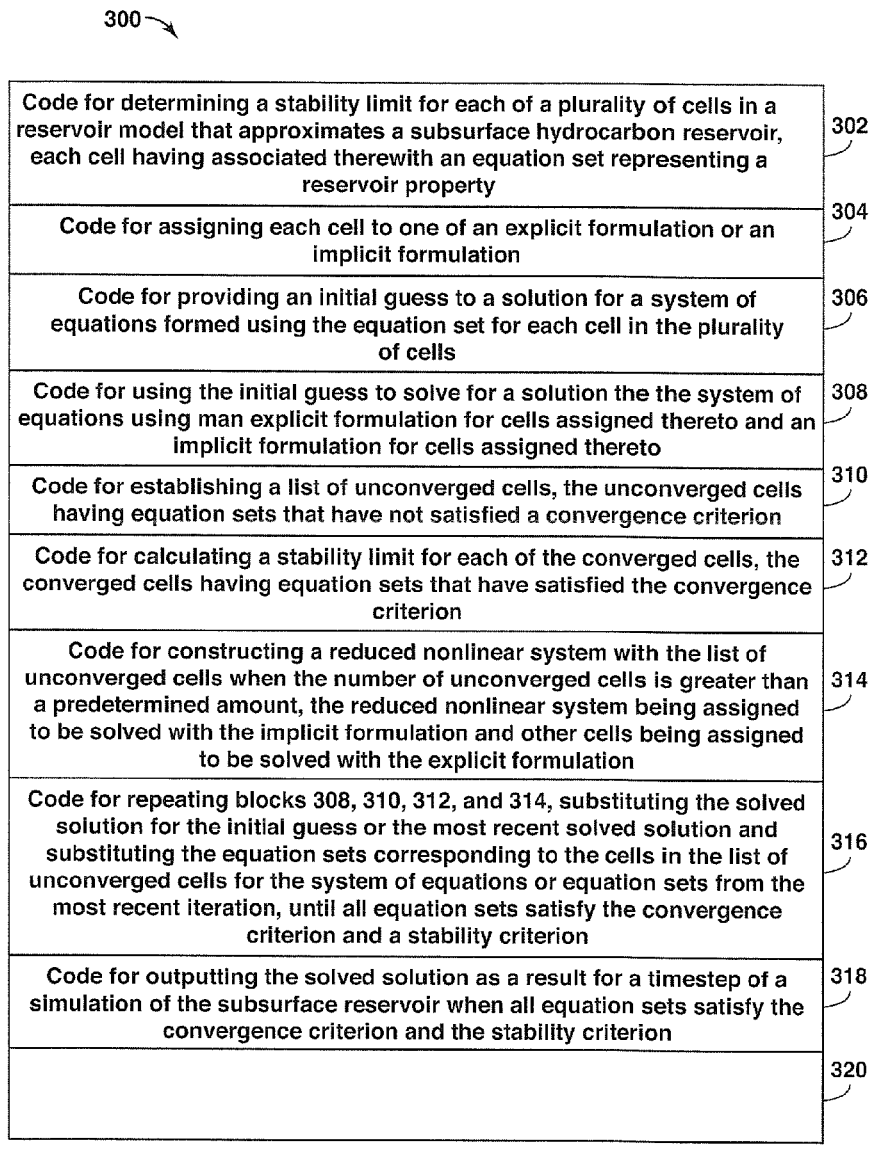
FIG. 16 is a block diagram of machine-readable code.

FIG. 16 shows a representation of machine-readable code 300 that may be used with a computing system such as computing system 210. At block 302 code is provided for determining a stability limit for each of a plurality of cells in a reservoir model that approximates a subsurface hydrocarbon reservoir. Each cell has associated therewith an equation set representing a reservoir property. At block 304 code is provided for assigning each cell to an explicit formulation or an implicit formulation. At block 306 code is provided for providing an initial guess to a solution for a system of equations formed using the equation set for each cell in the plurality of cells. At block 308 code is provided for using the initial guess to solve for a solution to the system of equations using an explicit formulation for cells assigned thereto and an implicit formulation for cells assigned thereto. At block 310 code is provided for establishing a list of unconverged cells. The unconverged cells have equation sets that have not satisfied a convergence criterion. At block 312 code is provided for calculating a stability limit for each of the converged cells. The converged cells have equation sets that have satisfied the convergence criterion. At block 314 code is provided for constructing a reduced nonlinear system with the list of unconverged cells when the number of unconverged cells is greater than a predetermined amount. The reduced nonlinear system is assigned to be solved with the implicit formulation, and other cells are assigned to be solved with the explicit formulation. At block 316 code is provided for repeating the using, establishing, calculating, and constructing parts of the code, substituting the solved solution for the initial guess or the most recent solved solution and substituting the equation sets corresponding to the cells in the list of unconverged cells for the system of equations or equation sets from the most recent iteration, until all equation sets satisfy the convergence criterion and a stability criterion. At block 318 code is provide for outputting the solved solution as a result for a timestep of a simulation of the subsurface reservoir when all equation sets satisfy the convergence criterion and the stability criterion. Code effectuating or executing other features of the disclosed aspects and methodologies may be provided as well. This additional code is represented in FIG. 16 as block 320, and may be placed at any location within code 300 according to computer code programming techniques.

Figure 17:
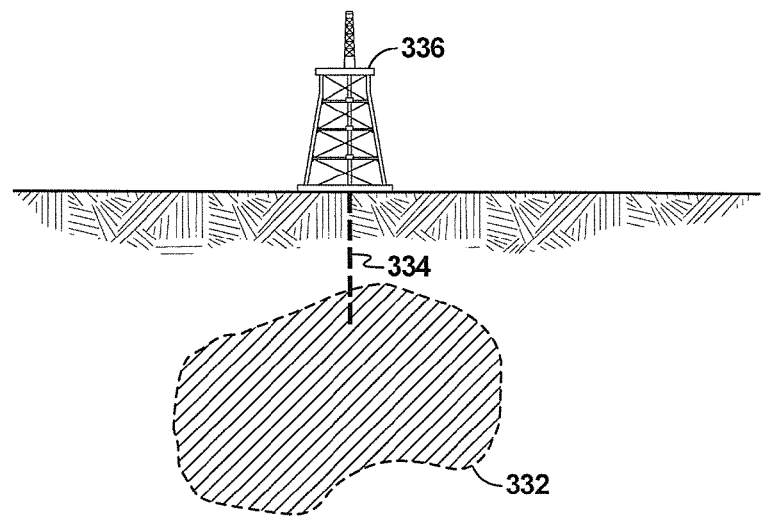
FIG. 17 is a side elevational view of a hydrocarbon management activity.
Figure 18:
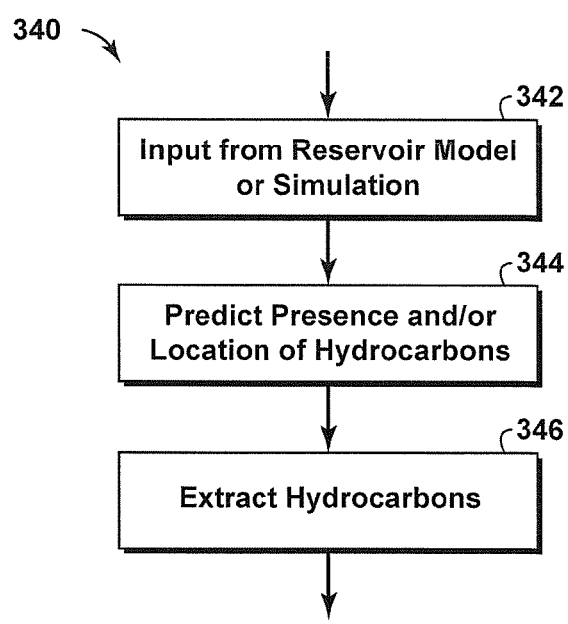
FIG. 18 is a flowchart of a method of extracting hydrocarbons from a subsurface region.

Aspects disclosed herein may be used to perform hydrocarbon management activities such as extracting hydrocarbons from a subsurface region or reservoir, which is indicated by reference number 332 in FIG. 17. A method 340 of extracting hydrocarbons from subsurface reservoir 332 is shown in FIG. 18. At block 342 inputs are received from a numerical model, geologic model, or flow simulation of the subsurface region, where the model or simulation has been run or improved using the methods and aspects disclosed herein. At block 344 the presence and/or location of hydrocarbons in the subsurface region is predicted. At block 346 hydrocarbon extraction is conducted to remove hydrocarbons from the subsurface region, which may be accomplished by drilling a well 334 using oil drilling equipment 336 (FIG. 17). Other hydrocarbon management activities may be performed according to known principles.

The disclosed aspects, methodologies and techniques may be susceptible to various modifications, and alternative forms and have been shown only by way of example. The disclosed aspects, methodologies and techniques are not intended to be limited to the specifics of what is disclosed herein, but include all alternatives, modifications, and equivalents falling within the spirit and scope of the appended claims.

What is claimed is:

1. A method of performing a simulation of a subsurface hydrocarbon reservoir, the reservoir being approximated by a reservoir model having a plurality of cells, each cell having associated therewith an equation set representing a reservoir property, the method comprising:
   (a) determining a stability limit for each of the plurality of cells;
   (b) assigning each cell to one of an explicit formulation or an implicit formulation;
   (c) providing an initial guess to a solution for a system of equations formed using the equation set for each cell in the plurality of cells;
   (d) using the initial guess to solve for a solution to the system of equations using an explicit formulation for cells assigned thereto and an implicit formulation for cells assigned thereto;
   (e) establishing a list of unconverged cells, the unconverged cells having equation sets that have not satisfied a convergence criterion;
   (f) calculating a stability limit for each of the converged cells, the converged cells having equation sets that have satisfied the convergence criterion;
   (g) when the number of unconverged cells is greater than a predetermined amount, constructing a reduced nonlinear system with the list of unconverged cells, the reduced nonlinear system being assigned to be solved with the implicit formulation and other cells being assigned to be solved with the explicit formulation;
   (h) repeating parts (d), (e), (f) and (g), substituting the solved solution for the initial guess or the most recent solved solution and substituting the equation sets corresponding to the cells in the list of unconverged cells for the system of equations or equation sets from the most recent iteration, until all equation sets satisfy the convergence criterion and a stability criterion; and
   (i) when all equation sets satisfy the convergence criterion and the stability criterion, outputting the solved solution as a result for a timestep of a simulation of the subsurface reservoir.

2. The method of claim 1, further comprising using an iterative root-finding method with the initial guess to solve for the solution to the system of equations.

3. The method of claim 1 wherein the iterative root-finding method comprises Newton's Method.

4. The method of claim 1, further comprising adding, to the list of unconverged cells, converged cells with one or more reservoir properties exhibiting changes greater than a preset amount.

5. The method of claim 1, further comprising adding, to the list of unconverged cells, converged cells that do not satisfy the stability criterion.

6. The method of claim 1, further comprising adding, to the list of unconverged cells, any cell that is neighbor to a cell in the list of unconverged cells and that does not satisfy the stability criterion.

7. The method of claim 1, wherein the number of neighbor cells is between 1 and N-W, where N is the number of the plurality of cells in the reservoir model and W is the number of cells having equation sets that satisfy the convergence criterion.

8. The method of claim 1, wherein any cell that is neighbor to a cell in the list of unconverged cells and that does satisfy the stability criterion is assigned to be solved using the explicit formulation.

9. The method of claim 1, wherein the reservoir property is at least one of fluid pressure, fluid saturation, and fluid flow.

10. The method of claim 1, wherein some or all of the method is performed using a computer.

11. The method of claim 1, wherein the timestep of the simulation of the subsurface reservoir is a first timestep, the method further comprising:
   (j) repeating parts (a) through (i) at additional timesteps; and
   (k) outputting the solved solutions for the first timestep and the additional timesteps, the solved solutions simulating the subsurface reservoir over time.

12. The method of claim 1, wherein outputting the solved solution includes displaying the solved solution.

13. The method of claim 1, wherein the predetermined amount is zero.

14. The method of claim 1, further including employing a post-Newton material balance corrector when all equation sets satisfy the convergence criterion and the stability criterion.

15. The method of claim 14, wherein the post-Newton material balance corrector employs an explicit molar update or total volumetric flux conservation.

16. A method of performing a simulation of a subsurface hydrocarbon reservoir, the reservoir being approximated by a reservoir model having a plurality of cells, each cell having associated therewith an equation set representing a reservoir property including at least one of fluid pressure, saturation, and fluid flow, the method comprising:
  (a) determining a stability limit for each of the plurality of cells;
  (b) assigning each cell to one of an explicit formulation or an implicit formulation;
  (c) providing an initial guess to a solution for a system of equations formed using the equation set for each cell in the plurality of cells;
  (d) using the initial guess to solve for a solution to the system of equations using an explicit formulation for cells assigned thereto and an implicit formulation for cells assigned thereto;
  (e) establishing a list of unconverged cells, the unconverged cells having equation sets that have not satisfied a convergence criterion;
  (f) calculating a stability limit for each of the converged cells, the converged cells having equation sets that have satisfied the convergence criterion;
  (g) when the number of unconverged cells is greater than a predetermined amount, adding, to the list of unconverged cells,
    converged cells with one or more reservoir properties exhibiting changes greater than a preset amount,
    converged cells that do not satisfy the stability criterion, and
    any cell that is neighbor to a cell in the list of unconverged cells and that does not satisfy the stability criterion,
    and constructing a reduced nonlinear system with the list of unconverged cells, the reduced nonlinear system being assigned to be solved with the implicit formulation and other cells being assigned to be solved with the explicit formulation;
  (h) repeating parts (d), (e), (f) and (g), substituting the solved solution for the initial guess or the most recent solved solution and substituting the equation sets corresponding to the cells in the list of unconverged cells for the system of equations or equation sets from the most recent iteration, until all equation sets satisfy the convergence criterion and a stability criterion; and
  (i) when all equation sets satisfy the convergence criterion and the stability criterion, outputting the solved solution as a result for a timestep of a simulation of the subsurface reservoir.

17. The method of claim 16, wherein the timestep of the simulation of the subsurface reservoir is a first timestep, the method further comprising:
  (j) repeating parts (a) through (i) at additional timesteps; and
  (k) outputting the solved solutions for the first timestep and the additional timesteps, the solved solutions simulating the subsurface reservoir over time.

18. The method of claim 17, further including employing a post-Newton material balance corrector when all equation sets satisfy the convergence criterion and the stability criterion.

19. A computer program product comprising a non-transitory computer readable storage medium and computer executable logic recorded on said non-transitory computer readable storage medium, the computer program product further comprising:
  (a) code for determining a stability limit for each of a plurality of cells in a reservoir model that approximates a subsurface hydrocarbon reservoir, each cell having associated therewith an equation set representing a reservoir property;
  (b) code for assigning each cell to one of an explicit formulation or an implicit formulation;
  (c) code for providing an initial guess to a solution for a system of equations formed using the equation set for each cell in the plurality of cells;
  (d) code for using the initial guess to solve for a solution to the system of equations using an explicit formulation for cells assigned thereto and an implicit formulation for cells assigned thereto;
  (e) code for establishing a list of unconverged cells, the unconverged cells having equation sets that have not satisfied a convergence criterion;
  (f) code for calculating a stability limit for each of the converged cells, the converged cells having equation sets that have satisfied the convergence criterion;
  (g) code for constructing a reduced nonlinear system with the list of unconverged cells when the number of unconverged cells is greater than a predetermined amount, the reduced nonlinear system being assigned to be solved with the implicit formulation and other cells being assigned to be solved with the explicit formulation;
  (h) code for repeating parts (d), (e), (f) and (g), substituting the solved solution for the initial guess or the most recent solved solution and substituting the equation sets corresponding to the cells in the list of unconverged cells for the system of equations or equation sets from the most recent iteration, until all equation sets satisfy the convergence criterion and a stability criterion; and
  (i) code for outputting the solved solution as a result for a timestep of a simulation of the subsurface reservoir when all equation sets satisfy the convergence criterion and the stability criterion.

20. The computer program product of claim 19, further comprising code for adding, to the list of unconverged cells,
  converged cells with one or more reservoir properties exhibiting changes greater than a preset amount,
  converged cells that do not satisfy the stability criterion, and
  any cell that is neighbor to a cell in the list of unconverged cells and that does not satisfy the stability criterion,
  when the number of unconverged cells is greater than a predetermined amount.

21. The computer program product of claim 19, wherein the timestep is a first timestep, and further comprising:
  (j) code for repeating parts (a) through (i) at additional timesteps; and
  (l) outputting the solved solutions for the first timestep and the additional timesteps, the solved solutions simulating the subsurface reservoir over time.

22. A method of managing hydrocarbon resources, comprising:
  (a) approximating a subsurface hydrocarbon reservoir with a reservoir model having a plurality of cells, each cell having associated therewith an equation set representing a reservoir property;
  (b) determining a stability limit for each of the plurality of cells;
  (c) assigning each cell to one of an explicit formulation or an implicit formulation;
  (d) providing an initial guess to a solution for a system of equations formed using the equation set for each cell in the plurality of cells;
  (e) using the initial guess to solve for a solution to the system of equations using an explicit formulation for cells assigned thereto and an implicit formulation for cells assigned thereto;

(f) establishing a list of unconverged cells, the unconverged cells having equation sets that have not satisfied a convergence criterion;
(g) calculating a stability limit for each of the converged cells, the converged cells having equation sets that have satisfied the convergence criterion;
(h) when the number of unconverged cells is greater than a predetermined amount, constructing a reduced nonlinear system with the list of unconverged cells, the reduced nonlinear system being assigned to be solved with the implicit formulation and other cells being assigned to be solved with the explicit formulation;
(i) repeating parts (e), (f), (g) and (h), substituting the solved solution for the initial guess or the most recent solved solution and substituting the equation sets corresponding to the cells in the list of unconverged cells for the system of equations or equation sets from the most recent iteration, until all equation sets satisfy the convergence criterion and a stability criterion;
(j) when all equation sets satisfy the convergence criterion and the stability criterion, outputting the solved solution as a result of a timestep of a simulation of the subsurface reservoir; and
(k) managing hydrocarbon resources using the simulation of the subsurface reservoir.

23. The method of claim 22, wherein the simulated characteristic is fluid flow in the subsurface reservoir.

24. The method of claim 22, wherein managing hydrocarbons comprises extracting hydrocarbons from the subsurface reservoir.

* * * * *